(12) United States Patent
Kim et al.

(10) Patent No.: US 8,221,560 B2
(45) Date of Patent: Jul. 17, 2012

(54) LEAD FREE SOLDER ALLOY

(75) Inventors: Kang Hee Kim, Ulsan (KR); Yong Cheol Chu, Ulsan (KR); Myoung Ho Chun, Ulsan (KR); Sang Ho Jeon, Ulsan (KR); Hyun Kyu Lee, Ulsan (KR)

(73) Assignee: Duksan Hi-Metal Co., Ltd., Ulsan (KR)

( * ) Notice: Subject to any disclaimer, the term of this patent is extended or adjusted under 35 U.S.C. 154(b) by 635 days.

(21) Appl. No.: 12/309,382

(22) PCT Filed: Sep. 4, 2008

(86) PCT No.: PCT/KR2008/005218
§ 371 (c)(1),
(2), (4) Date: Jan. 15, 2009

(87) PCT Pub. No.: WO2009/084798
PCT Pub. Date: Jul. 9, 2009

(65) Prior Publication Data
US 2010/0272598 A1  Oct. 28, 2010

(30) Foreign Application Priority Data
Dec. 31, 2007 (KR) .................. 10-2007-0141666

(51) Int. Cl.
*B23K 35/22* (2006.01)

(52) U.S. Cl. .................. 148/400; 420/560; 420/561

(58) Field of Classification Search .................. 148/400; 420/560, 561
See application file for complete search history.

(56) References Cited

U.S. PATENT DOCUMENTS
5,755,896 A 5/1998 Paruchuri et al.
6,805,974 B2 10/2004 Choi et al.

FOREIGN PATENT DOCUMENTS
| CN | 1570166 | * | 1/2005 |
| JP | 2001205476 A | * | 7/2001 |
| JP | 2005-254298 | | 9/2005 |
| JP | 2006-035310 | | 2/2006 |
| KR | 10-2004-0077652 | | 9/2004 |
| KR | 10-0582764 | | 5/2006 |
| KR | 2007-038228 | | 2/2007 |

* cited by examiner

*Primary Examiner* — Sikyin Ip
(74) *Attorney, Agent, or Firm* — Dilworth & Barrese, LLP.

(57) ABSTRACT

Disclosed herein are a lead-free solder alloy and a manufacturing method thereof. More specifically, disclosed are: a lead-free solder alloy, which comprises 0.8-1.2 wt % silver (Ag), 0.8-1.2 wt % copper (Cu), 0.01-1.0 wt % palladium (Pd), 0.001-0.1 wt % tellurium (Te), and a balance of tin (Sn), and thus has a melting point similar to those of prior lead-free solder alloys, excellent wettability, very low segregation ratio, and excellent weldability with a welding base metal, such that it improves temperature cycle performance and drop impact resistance simultaneously, when it is applied to electronic devices and printed circuit boards; a manufacturing method of the above alloy; and electronic devices and printed circuit boards which include the same.

6 Claims, 24 Drawing Sheets

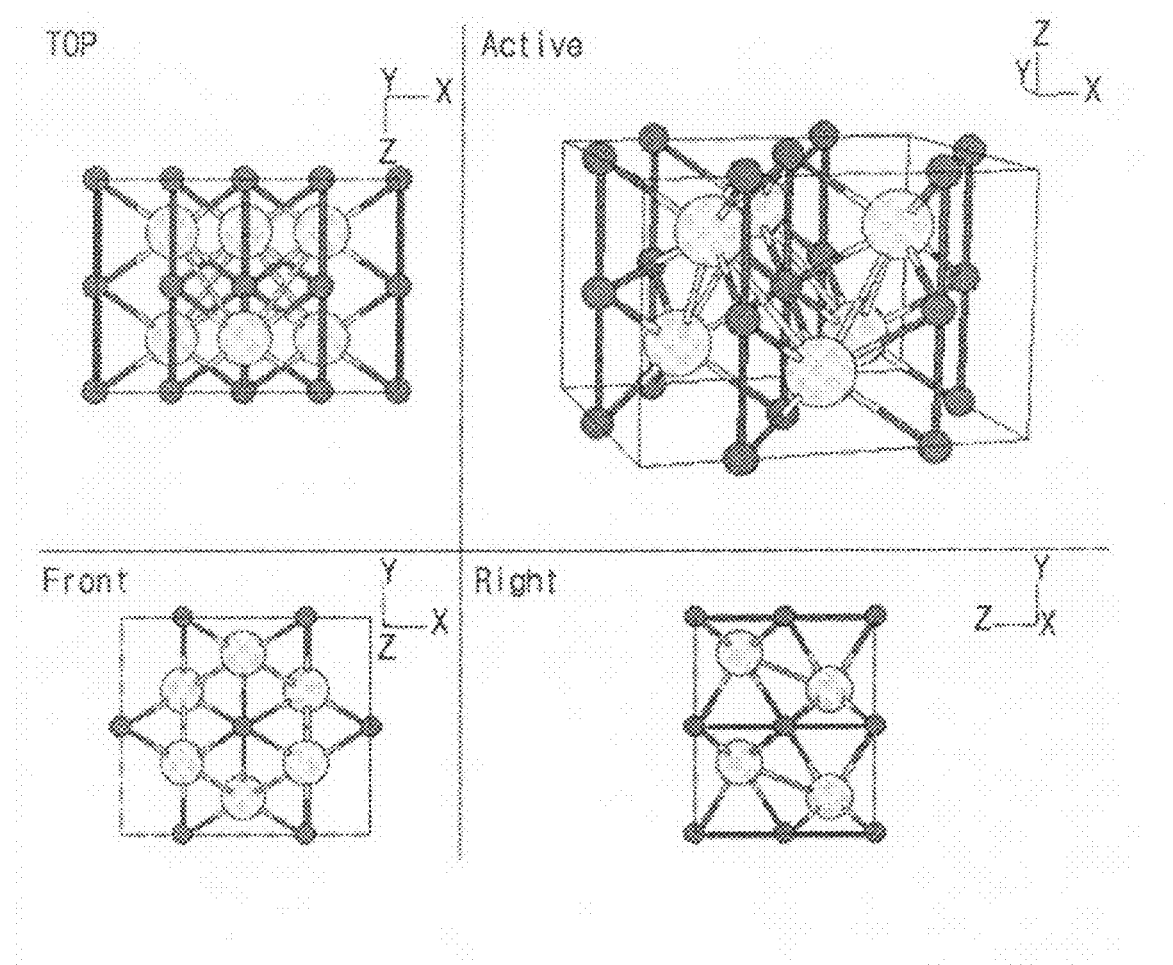

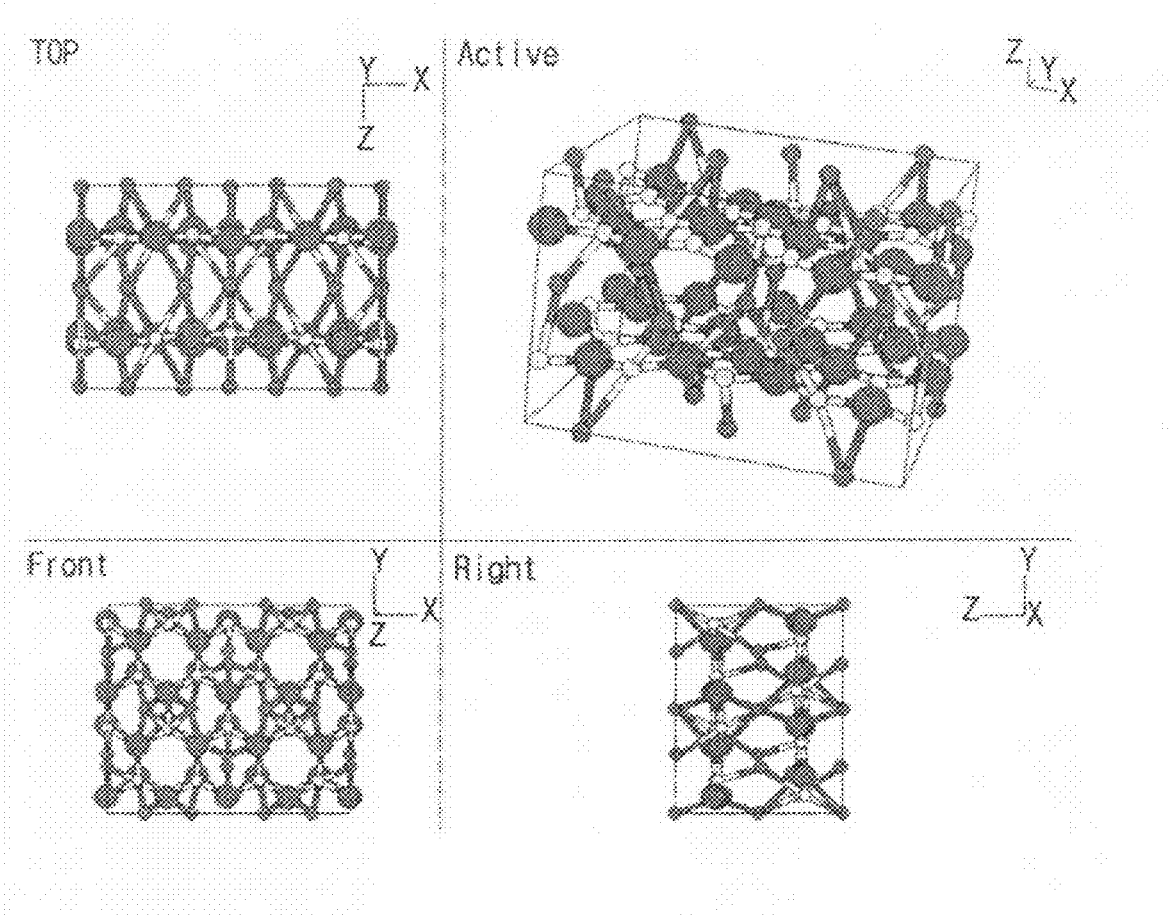
[Fig. 2]

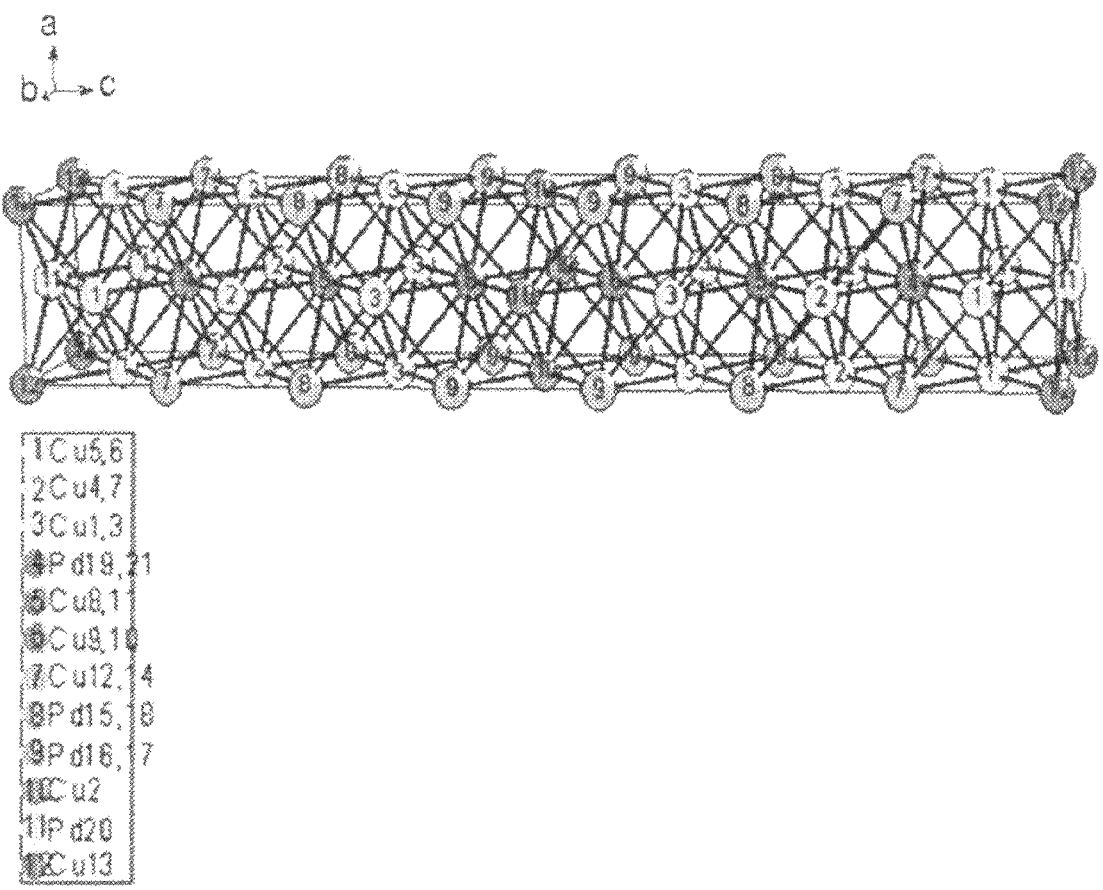
[Fig. 3]

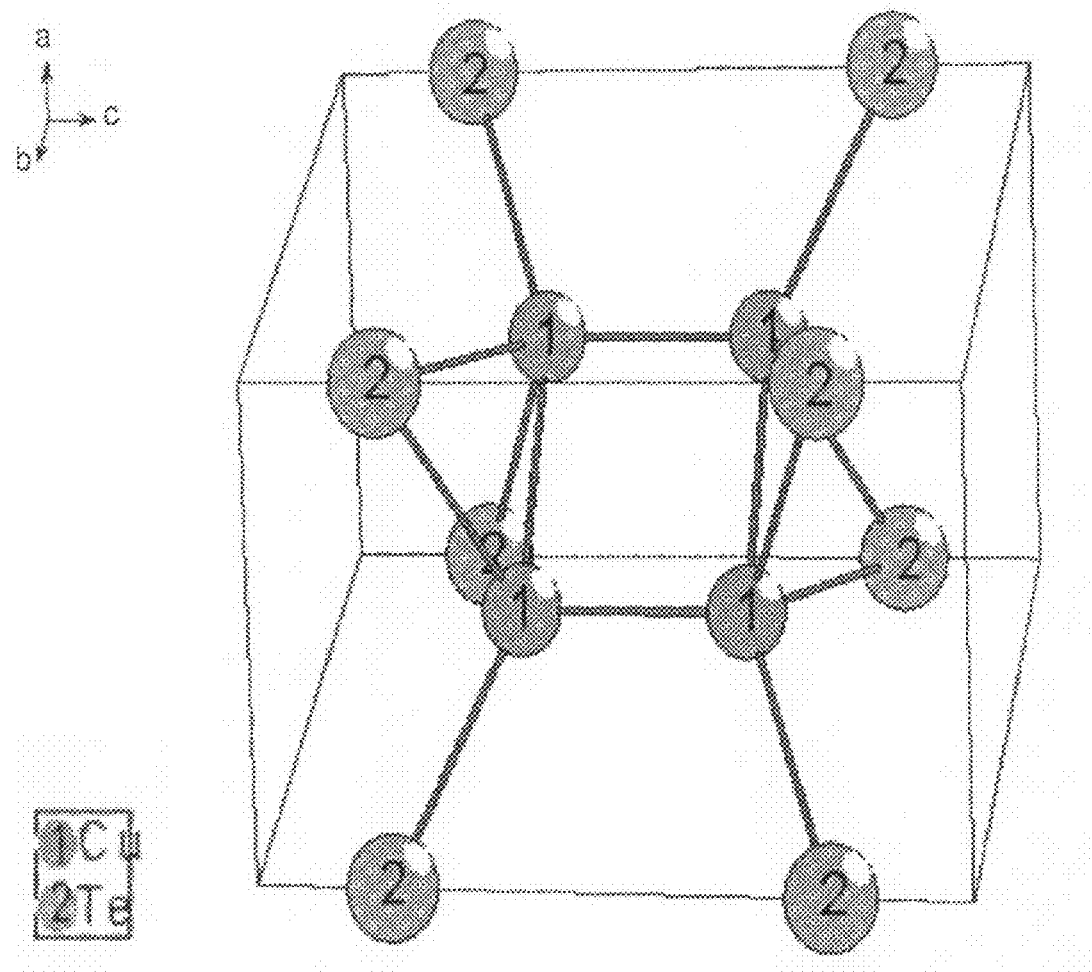
[Fig. 4]

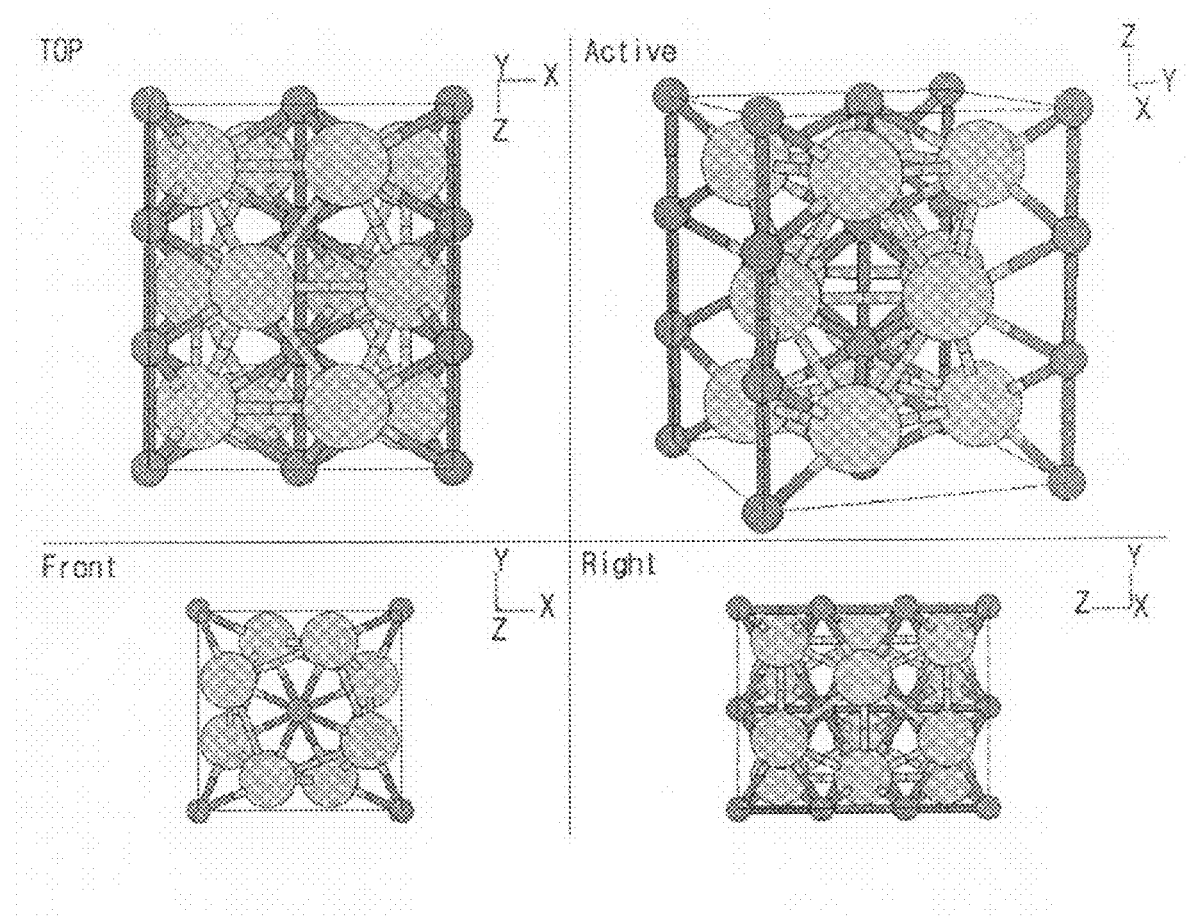
[Fig. 5]

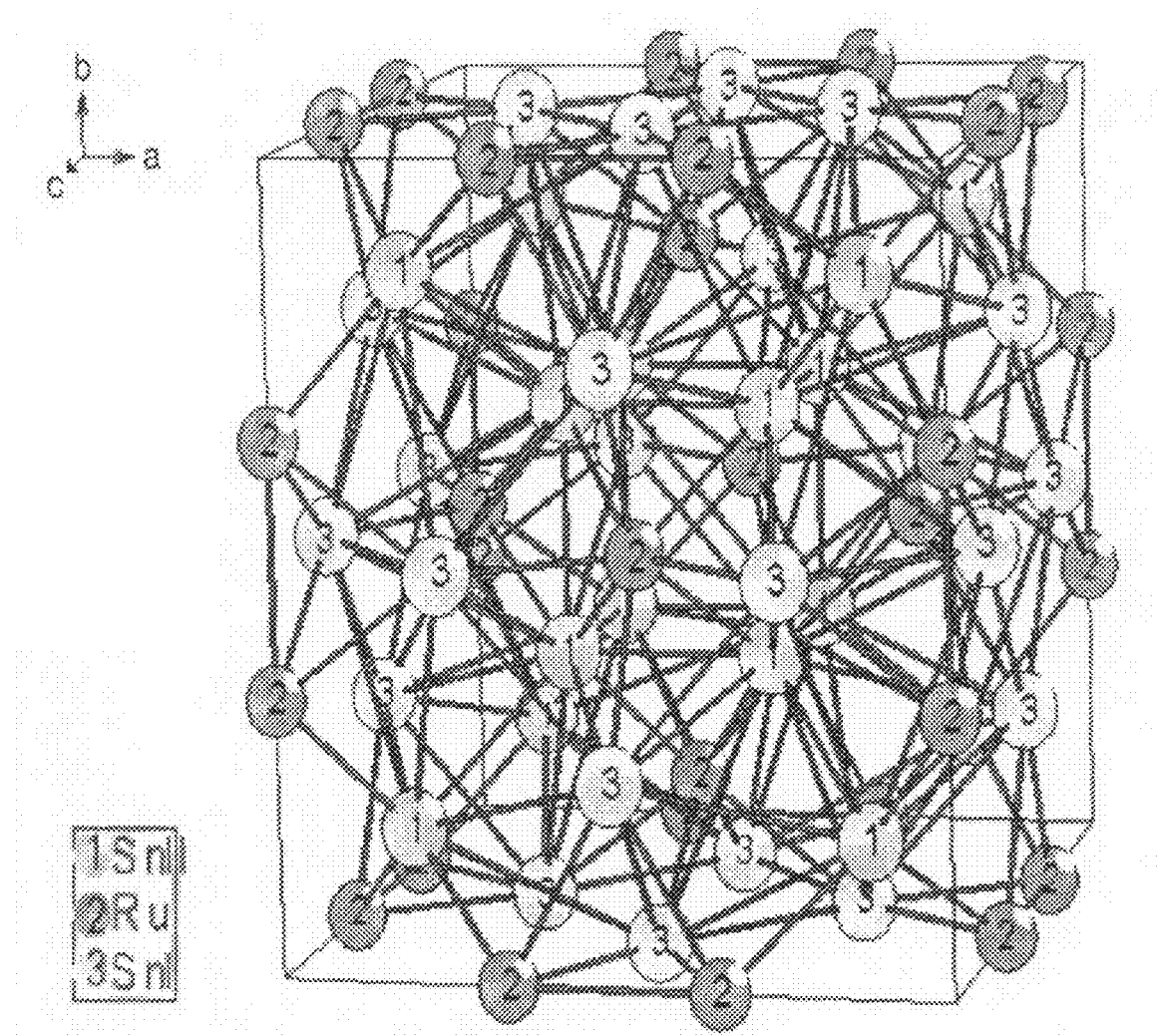
[Fig. 6]

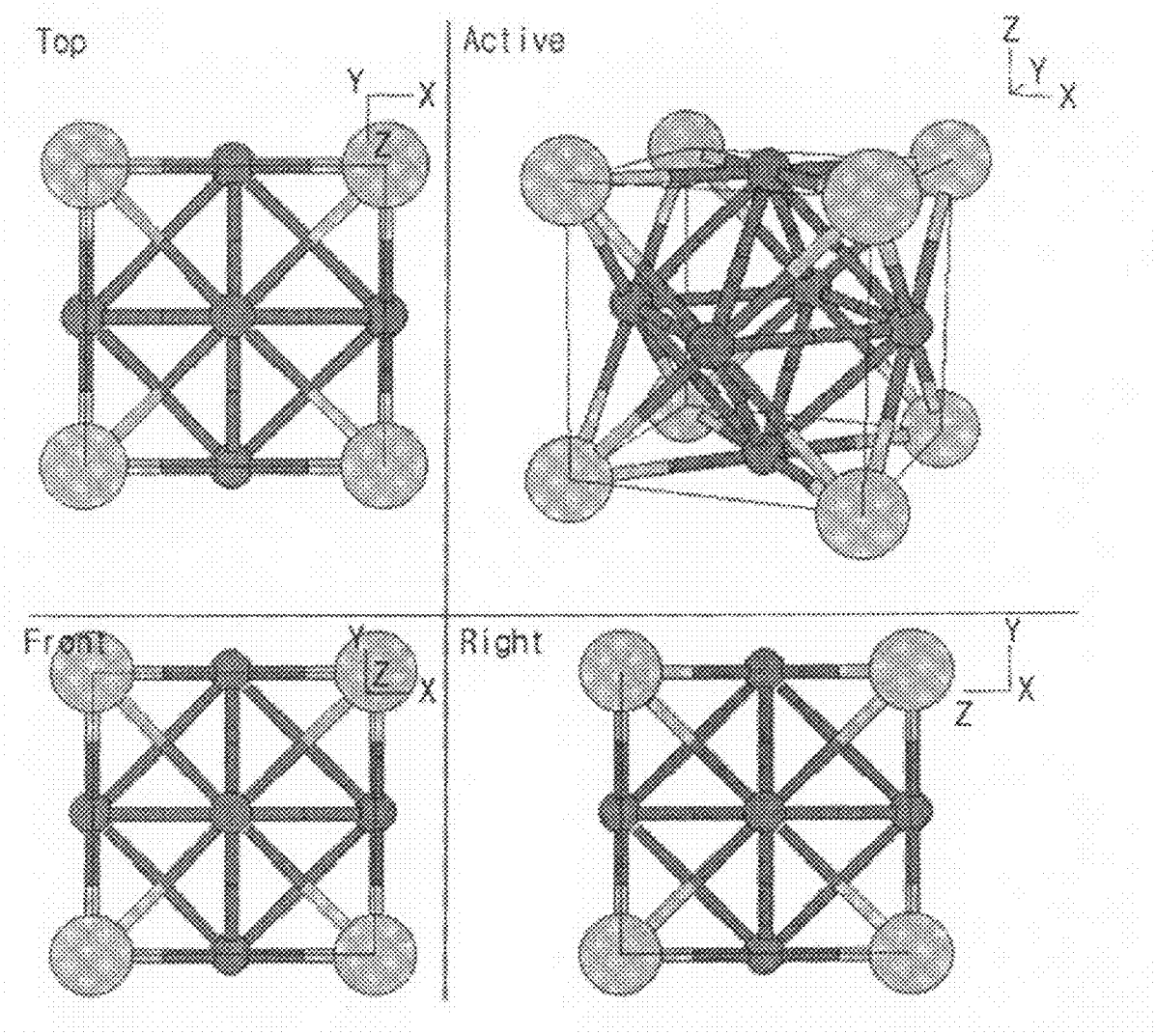

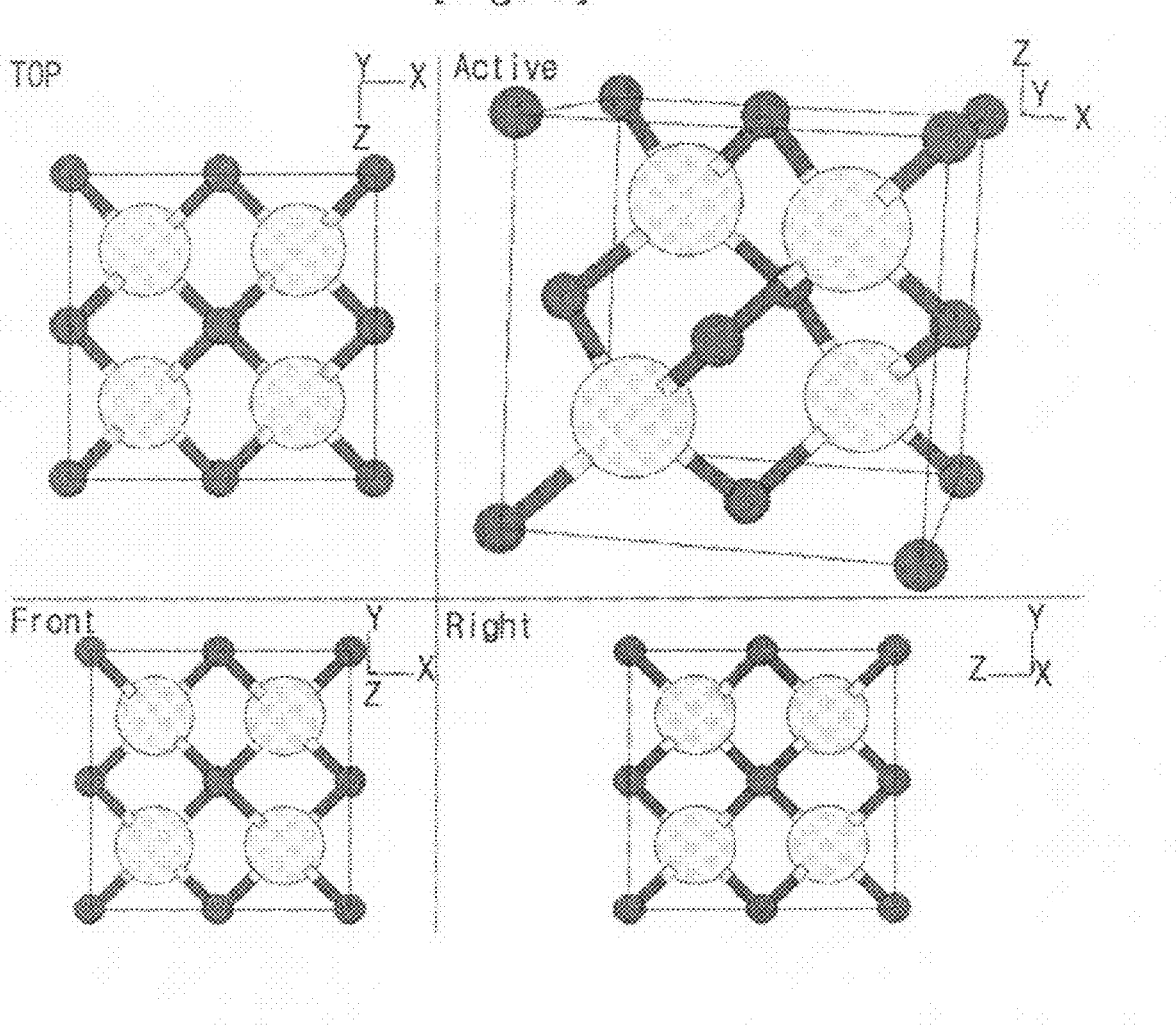
[Fig. 8]

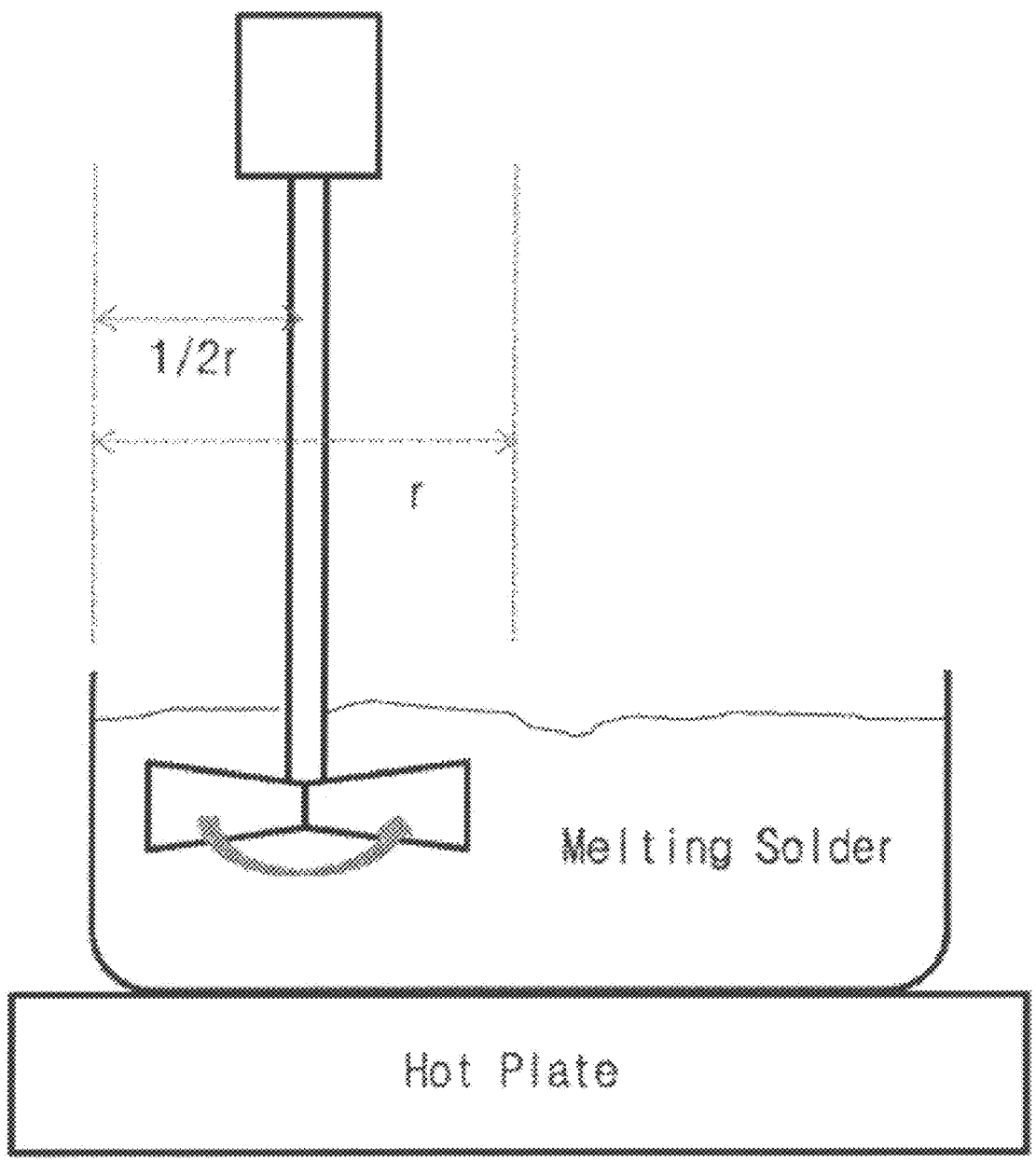
[Fig. 9]

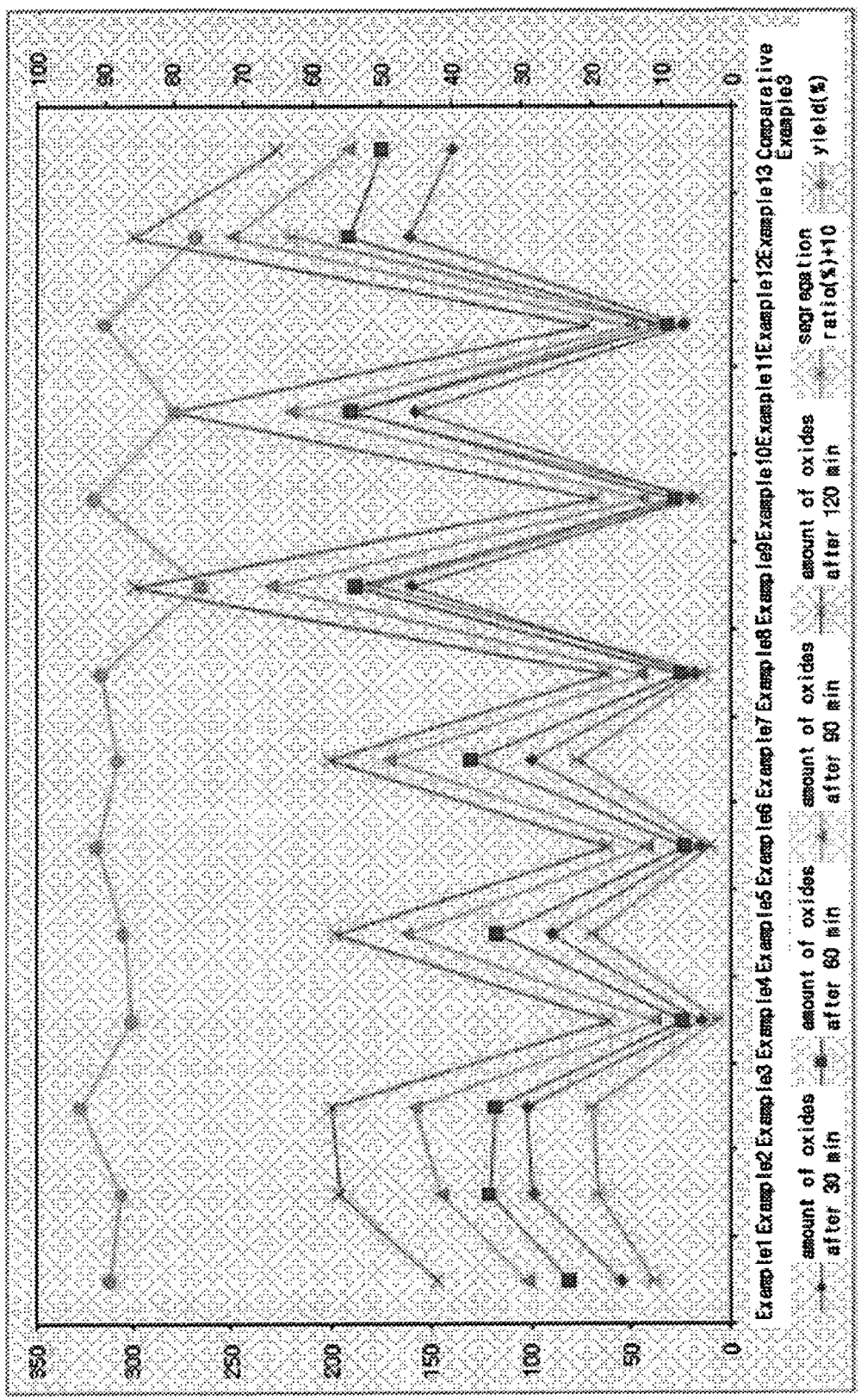
[Fig. 10]

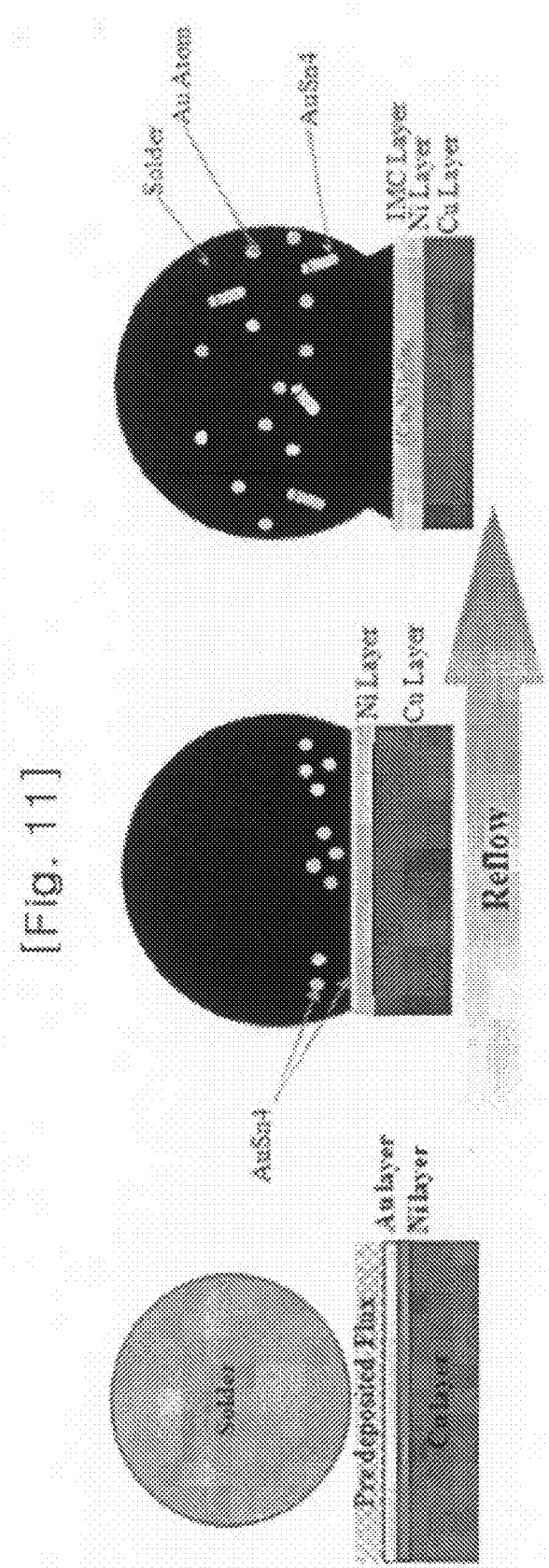
[Fig. 11]

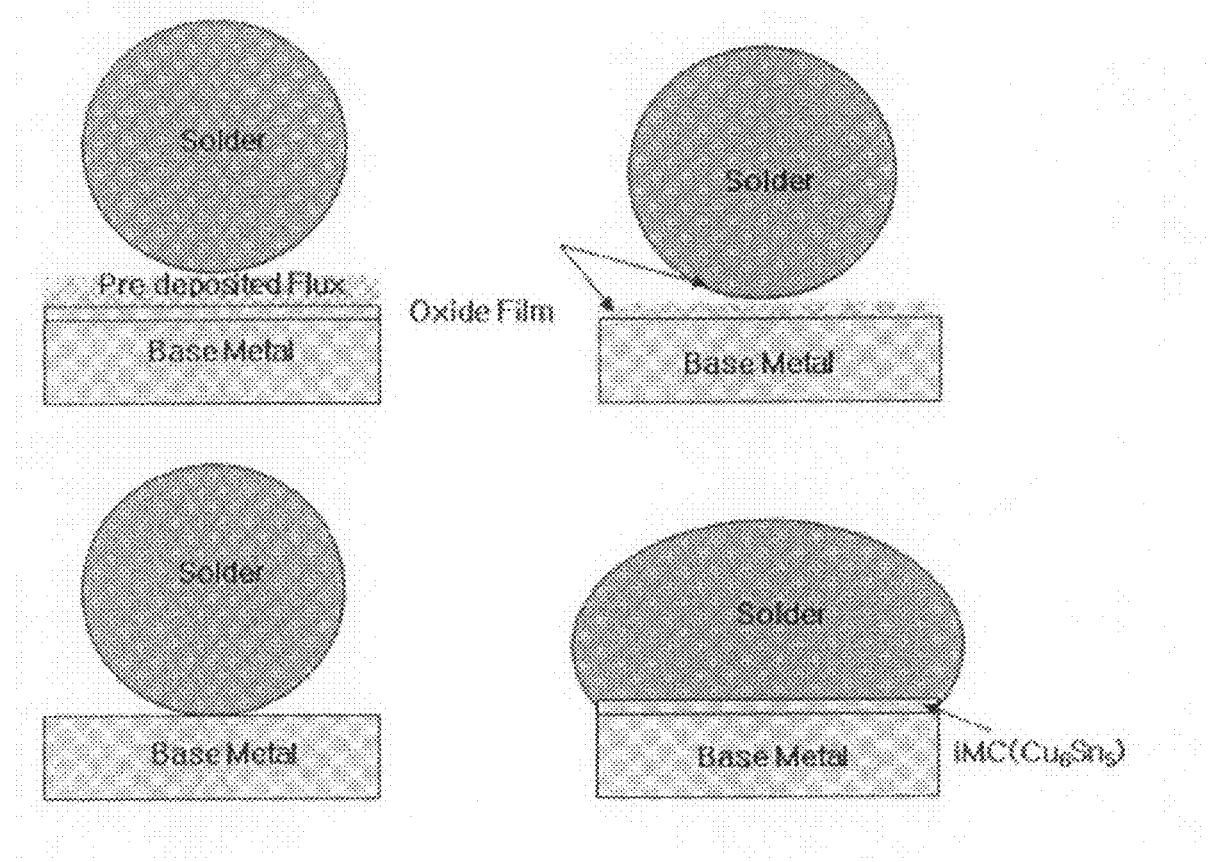
[Fig. 12]

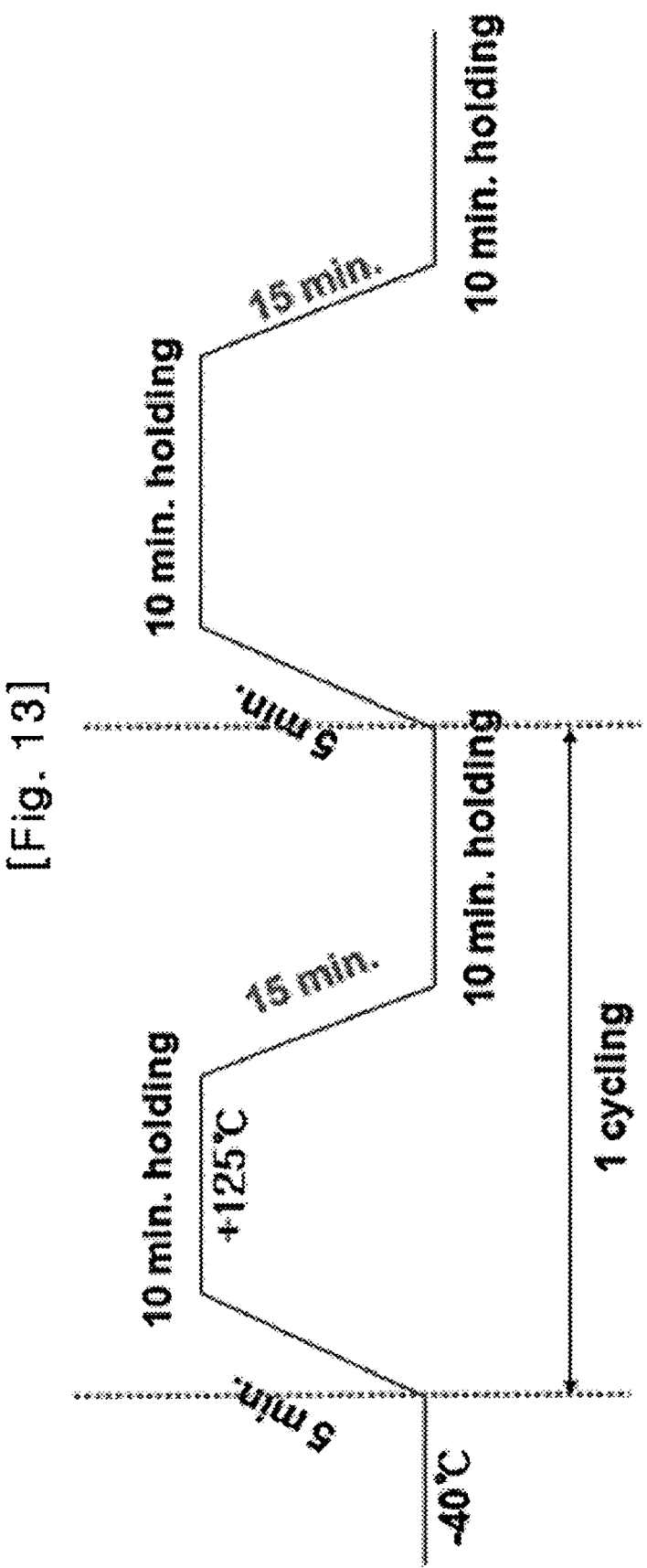
[Fig. 13]

[Fig. 14]
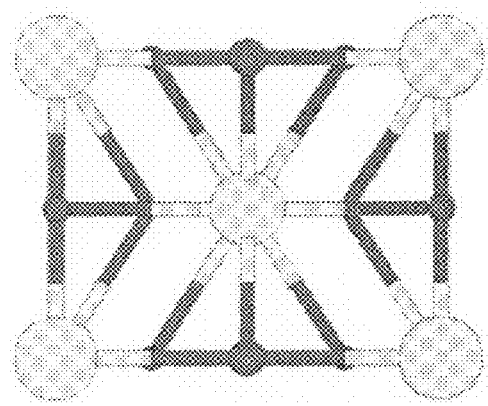
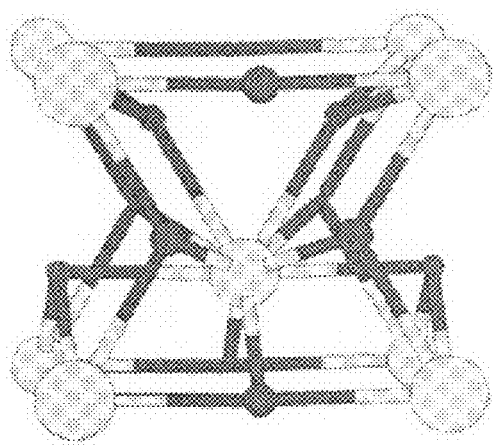
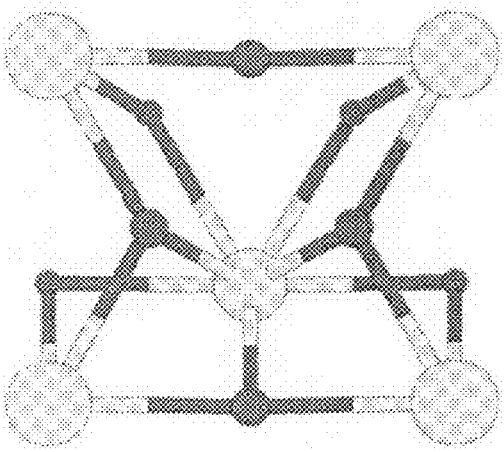
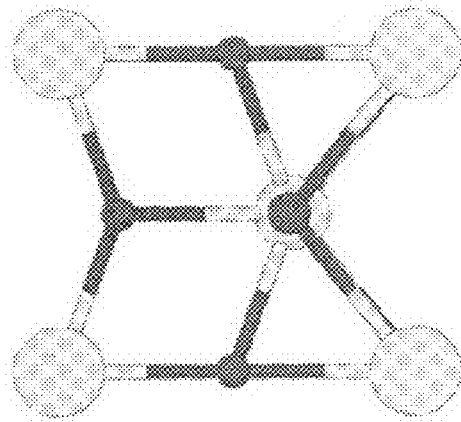

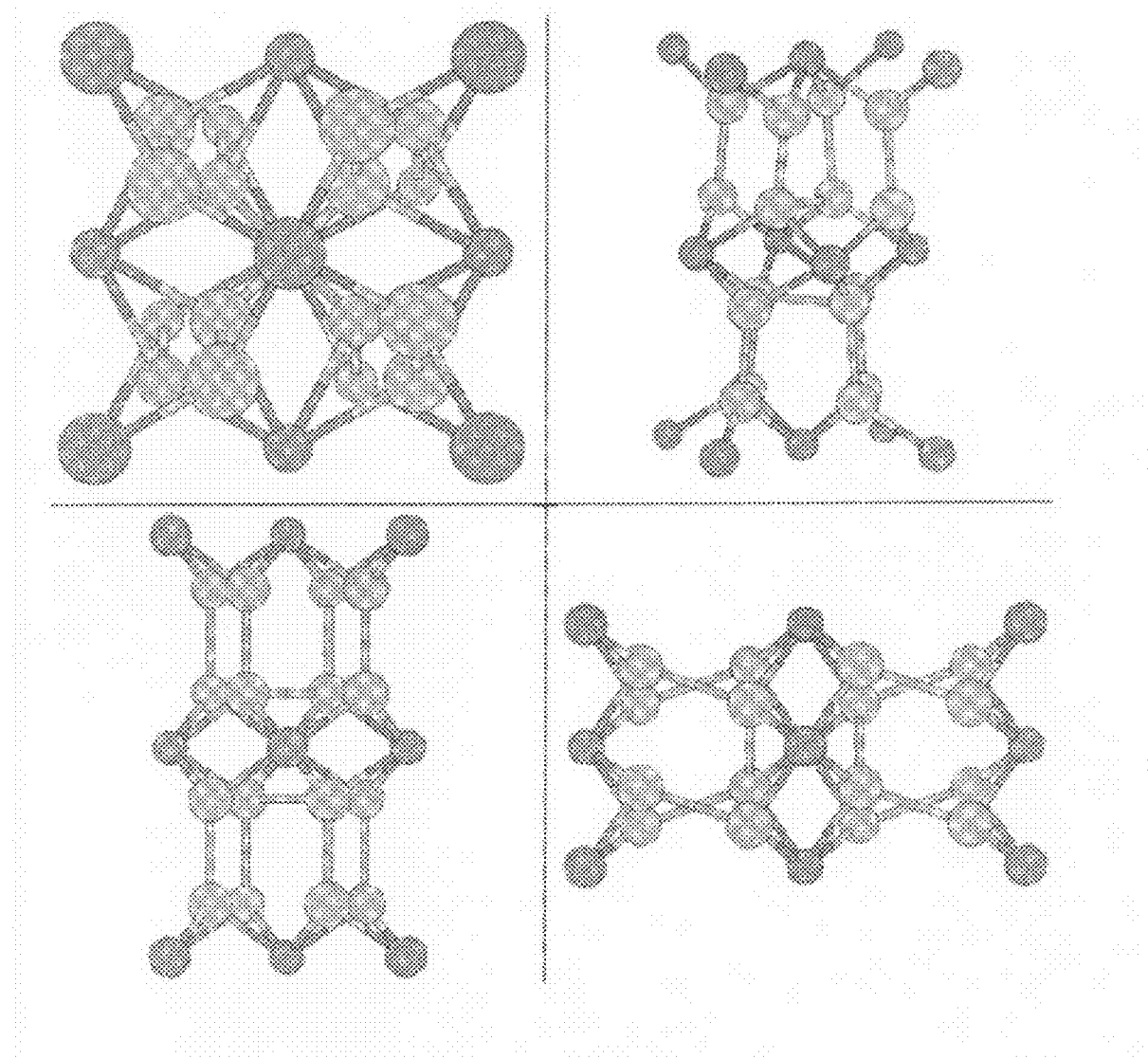
[Fig. 15]

[Fig. 16]
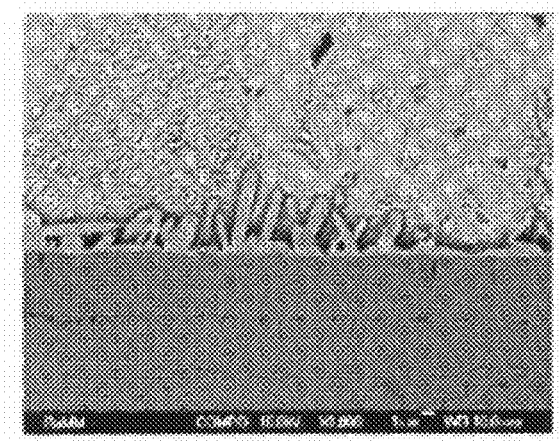
(a)
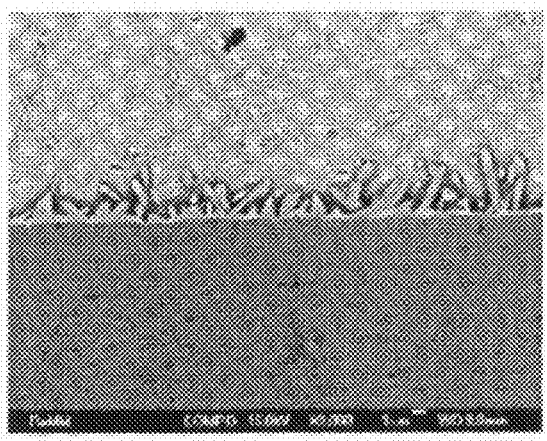
(b)
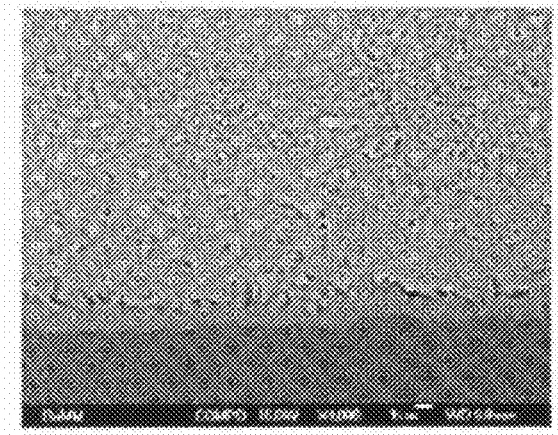
(c)
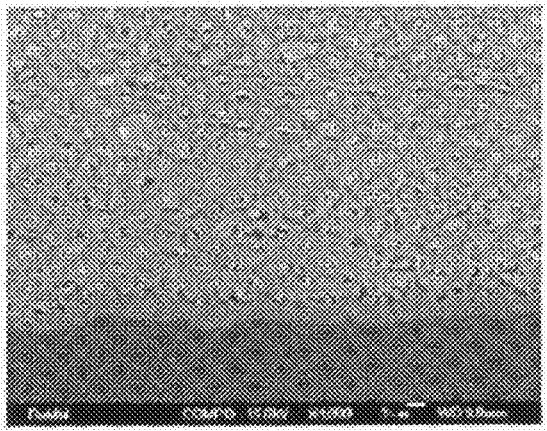
(d)

[Fig. 17]
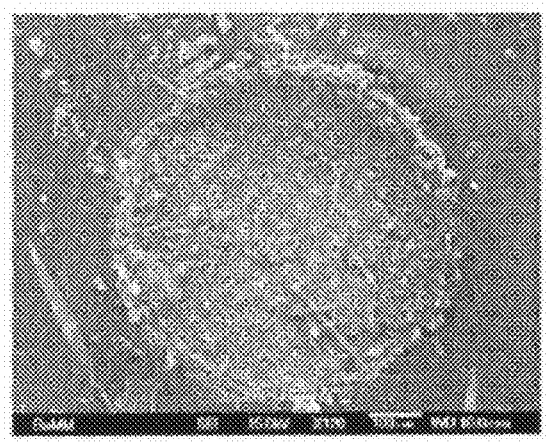
(a)
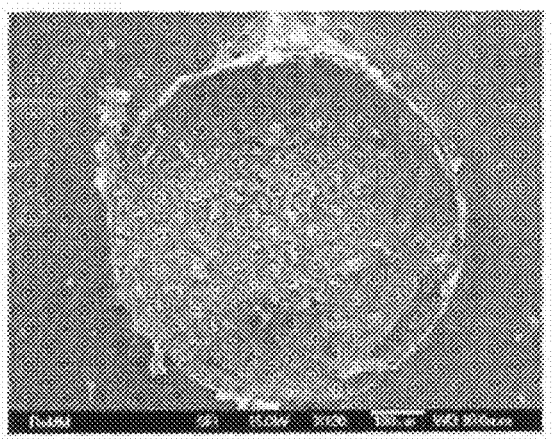
(b)
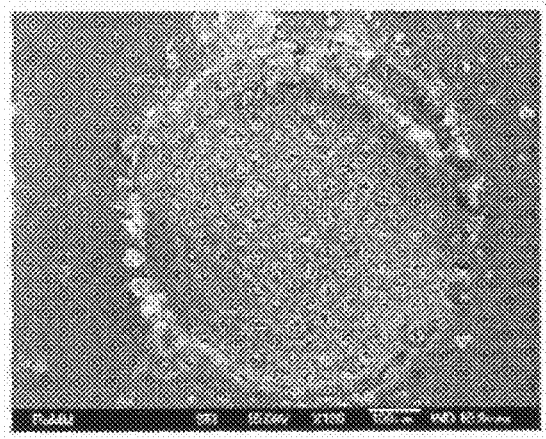
(c)
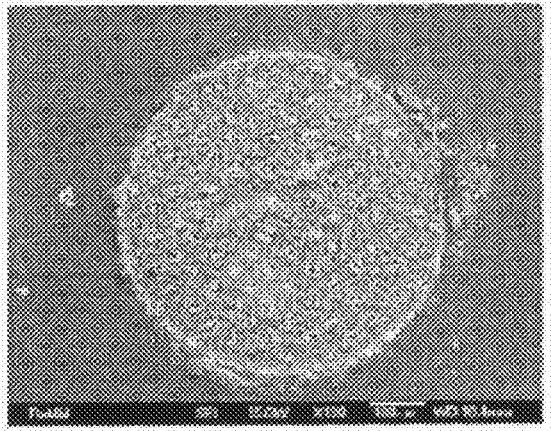
(d)

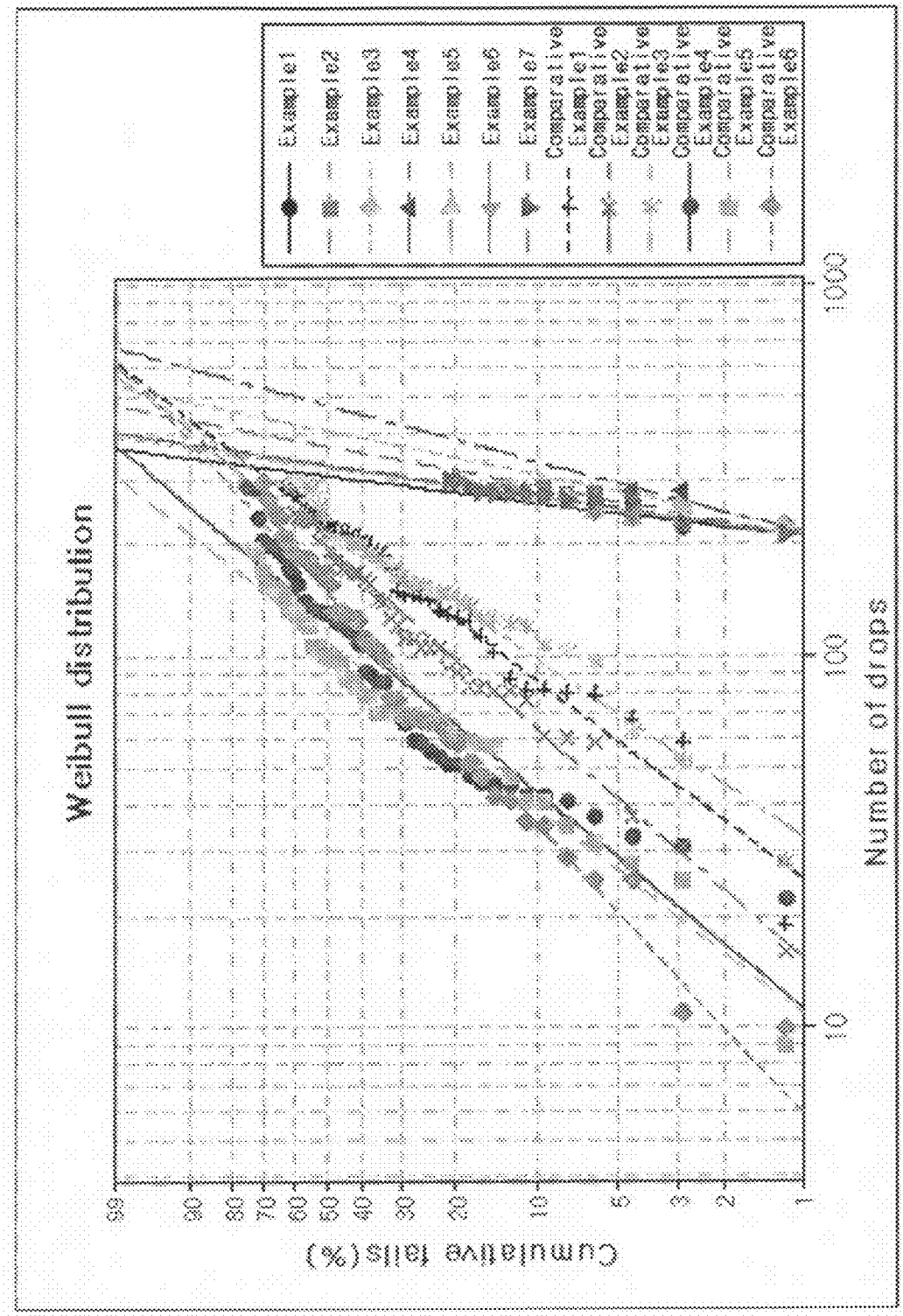
[Fig. 18]

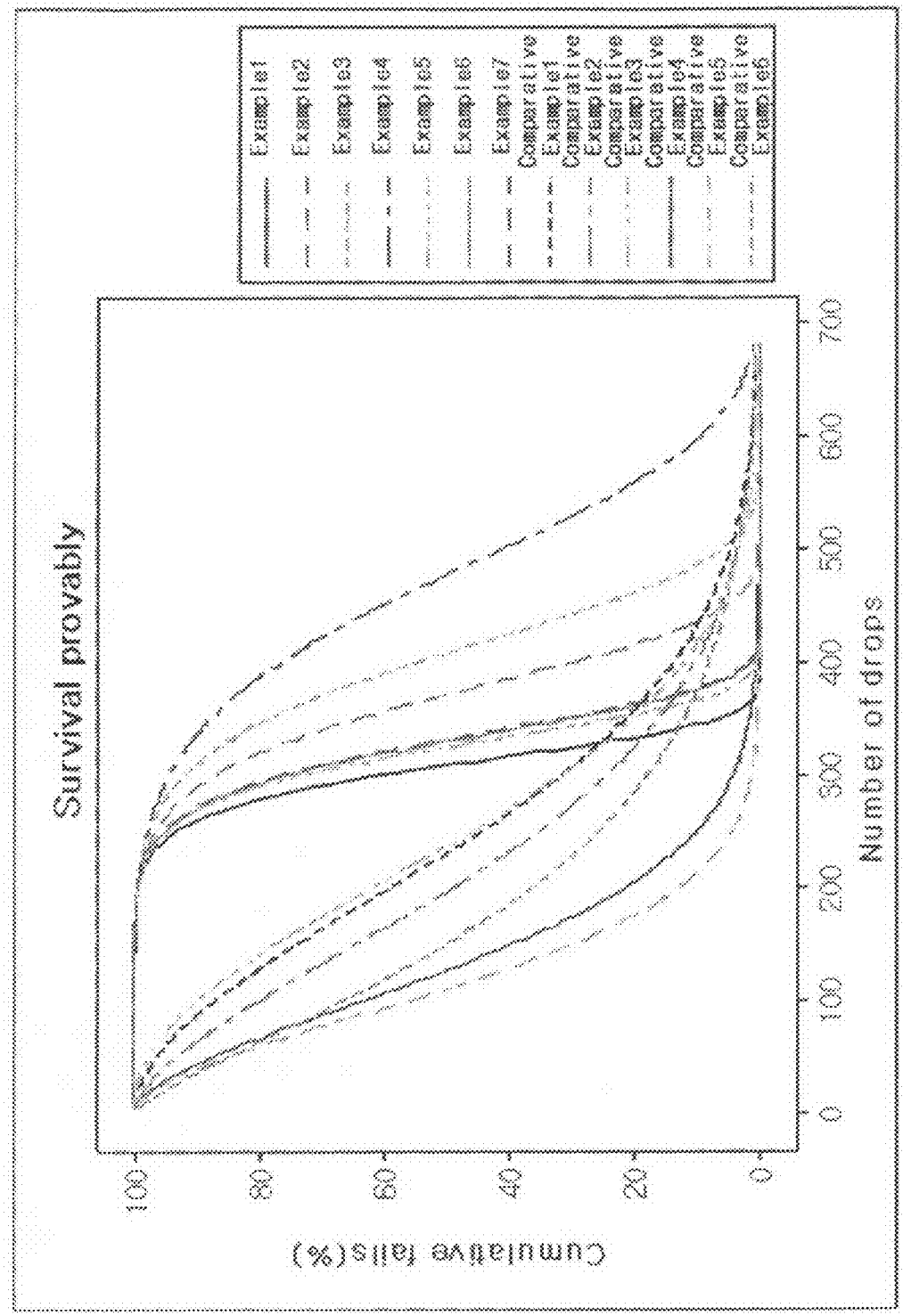
[Fig. 19]

[Fig. 20]
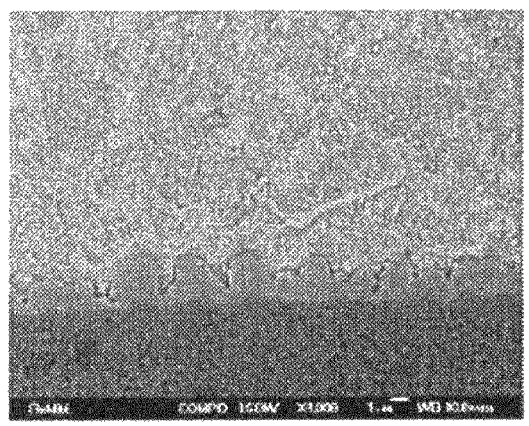
(a)
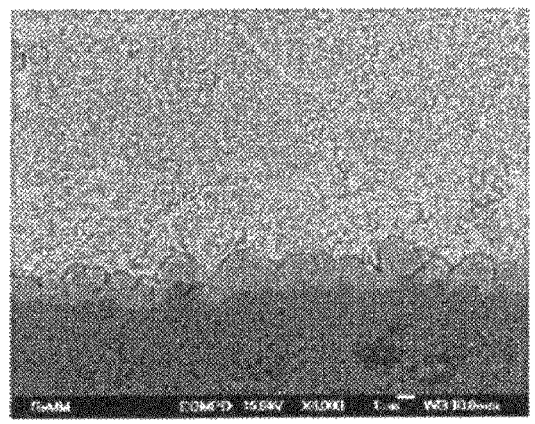
(b)
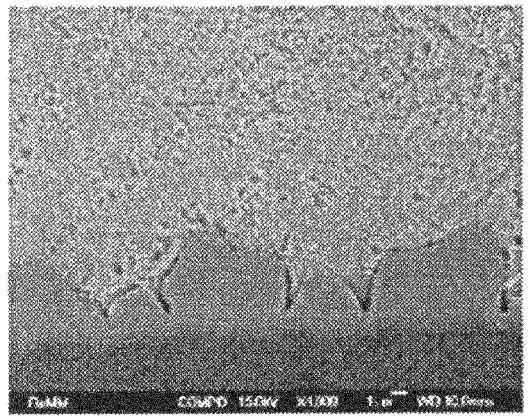
(c)
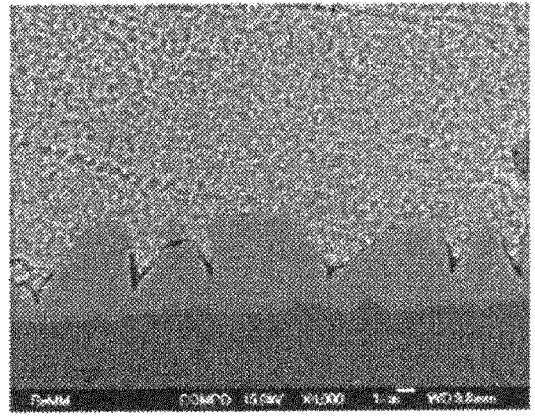
(d)

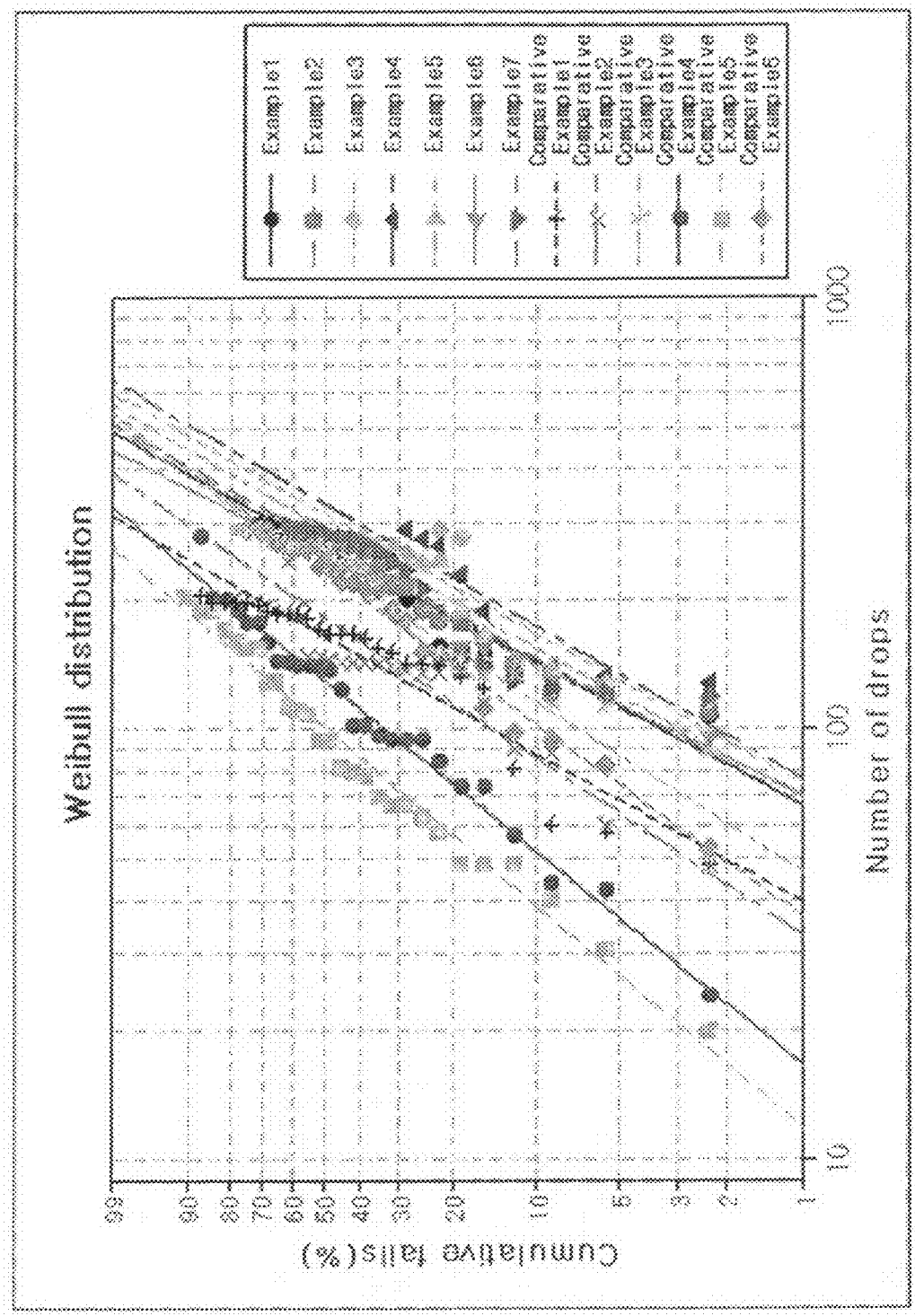

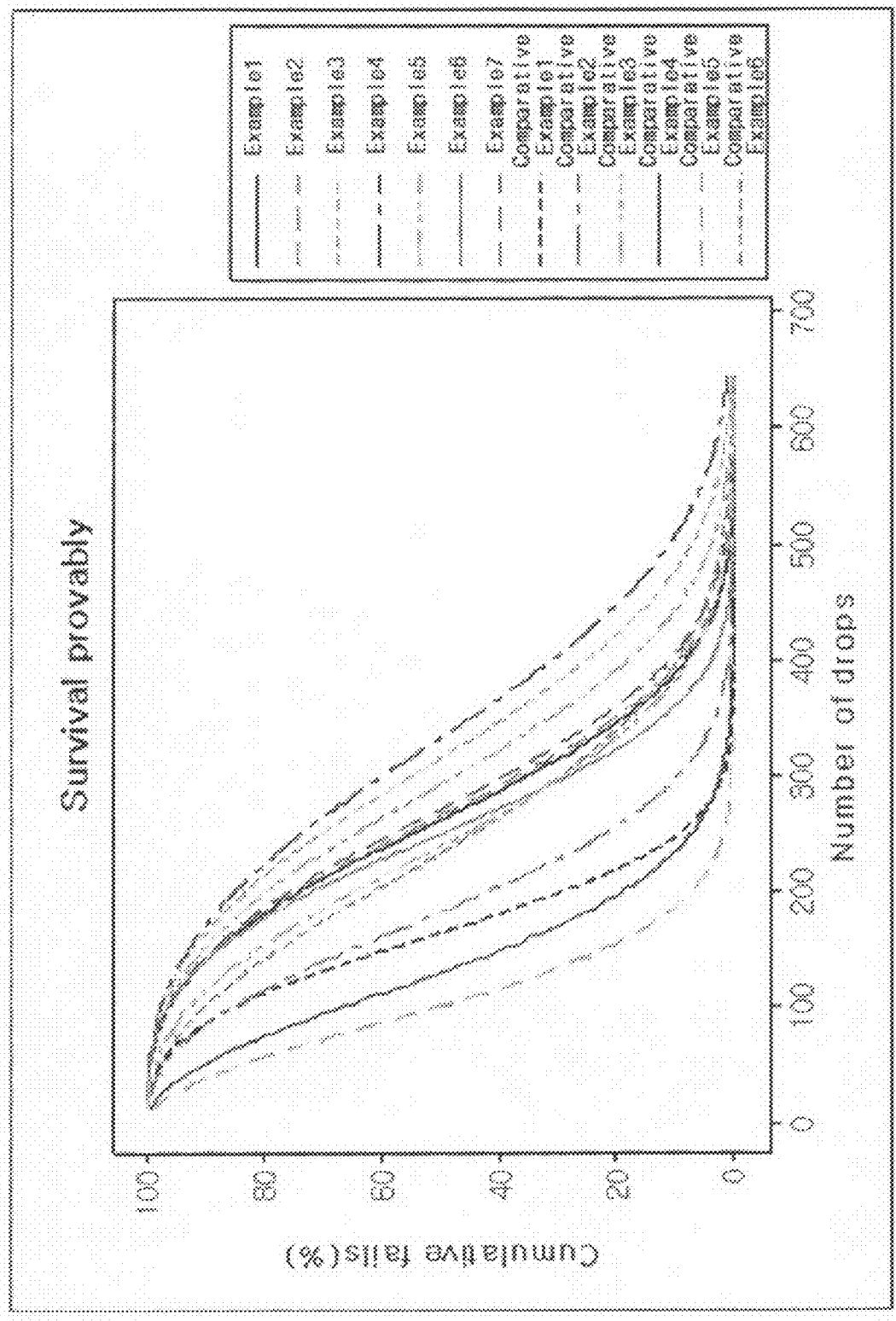
[Fig. 22]

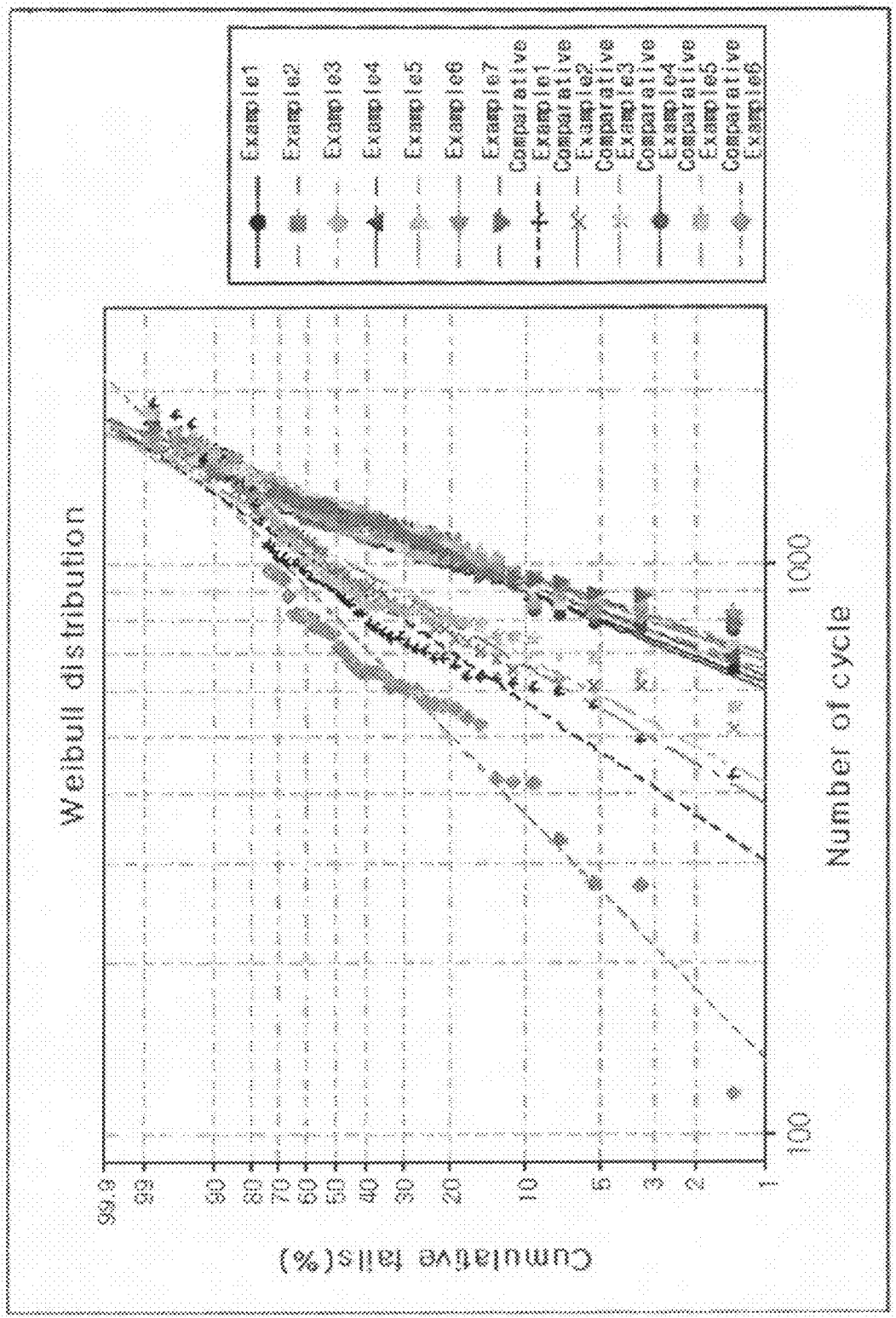
[Fig. 23]

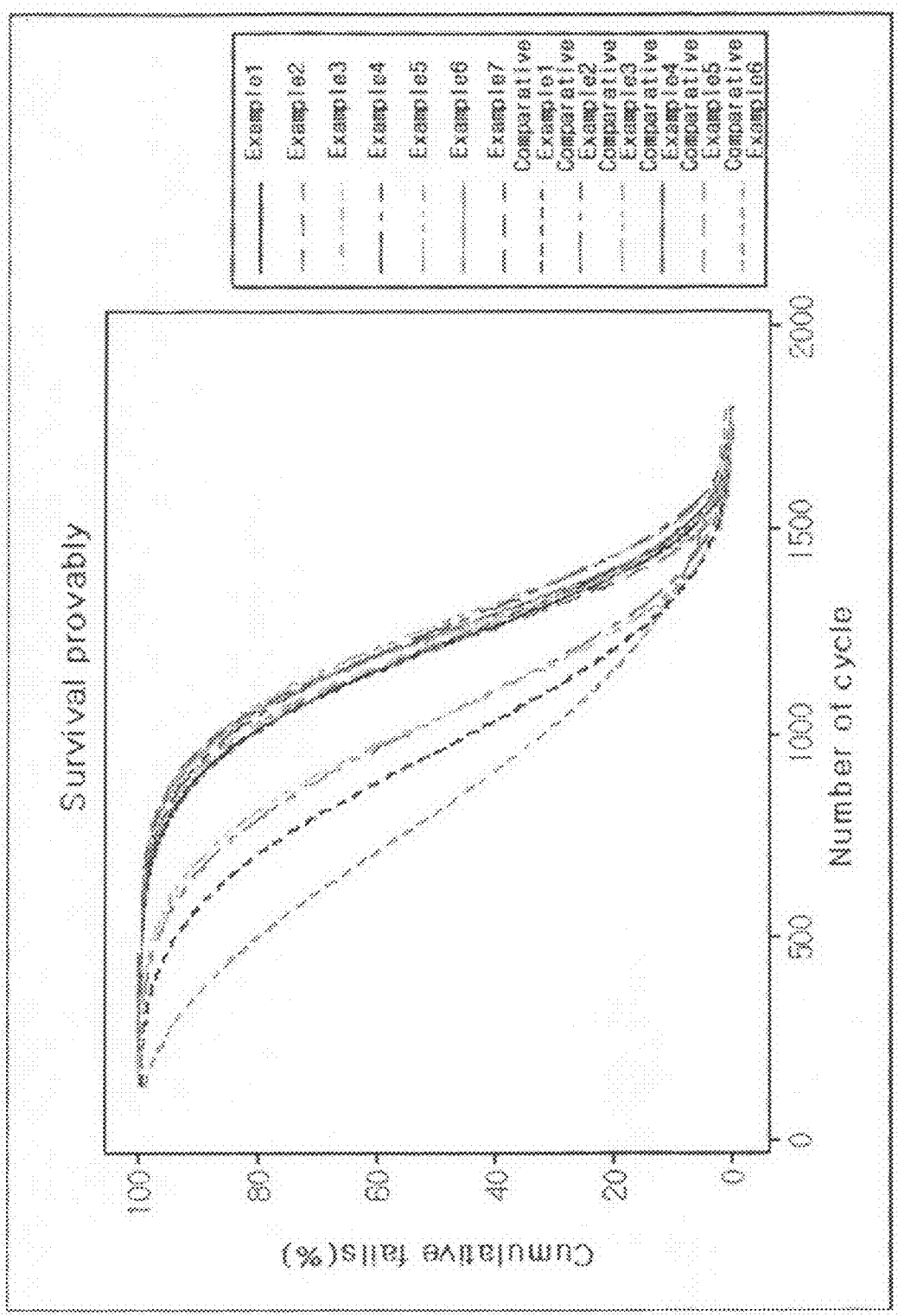

LEAD FREE SOLDER ALLOY

BACKGROUND OF THE INVENTION

1. Field of the Invention

The present invention relates to a lead-free solder alloy, which is used in, for example, printed circuit boards treated with nickel (Ni)/gold (Au), and a manufacturing method thereof. More specifically, the present invention relates to: a lead-free solder alloy, which has a melting point similar to those of prior lead-free solder alloys, excellent wettability, very low segregation ratio, and excellent weldability with a welding base metal, such that it improves temperature cycle performance and drop impact resistance simultaneously, when it is applied to electronic devices and printed circuit boards; a method for manufacturing said lead-free solder alloy; and electronic devices and printed circuit boards which include said lead-free solder alloy.

2. Description of the Prior Art

Recently, as portable digital devices having a small and thin design have gained in popularity, semiconductor packages mounted therein also have become thinner. Semiconductor packages serve to electrically connect semiconductor chips formed on wafers and seal and package the semiconductor chips, such that the semiconductor chips can be used by users in daily life. As portable digital devices have become high-performance and multifunctional, the number of semiconductor chips mounted therein have increased, whereas the entire size of the devices has become smaller.

Accordingly, reliability standards for solder joints applied in such electronic parts and portable digital devices have become significantly higher and more diverse. Particularly, as the use of portable digital devices has rapidly increased, the demand for products which simultaneously satisfy the temperature cycle performance and drop impact performance of solder joints has rapidly increased.

Lead-free solder alloys, which have been used in the prior art, are mostly ternary alloys based on tin (Sn), silver (Ag) and copper (Cu). As the content of silver (Ag) in such ternary alloys increases, the drop impact performance of the alloys shows a tendency to deteriorate, whereas the temperature cycle performance shows a tendency to improve. On the contrary, as the content of silver (Ag) decreases, the drop impact performance shows a tendency to improve whereas the temperature cycle performance shows a tendency to deteriorate.

Because solder joints provided with lead-free solder alloys serve to maintain mechanical strength and also function as heat diffusion channels, buffers against heat shocks, and channels providing electric flow, the solder joints require high reliability. Accordingly, studies on reactions between solders and substrates or between solders and printed circuit boards (PCBs) have been conducted for a long time.

In such studies, the most important issue occurring in joints between solders in lead-free solder alloys and substrates or between solders and printed circuit boards is how the reliabilities of solder joints, that is, thermal fatigue life, tensile strength and fracture toughness, are increased through the production and control of intermetallic compounds. However, the reliability of solder joints also definitely differs depending on the surface treatment of substrates and printed circuit boards.

In the prior art, lead-free solder alloys were generally used regardless of the surface treatment of substrates and printed circuit boards. During a reflow soldering process, intermetallic compound layers form intermetallic compounds which differ depending on the surface of the solders and substrates or the surface of solders and printed circuit boards, and the solder joint reliability varies depending on the intermetallic compound layers. The intermetallic compound layers produced by the wetting phenomena between solders and substrates and between solders and packages, grow at temperatures lower than the melting points thereof through solid-phase reactions. Herein, the growth of the intermetallic compound layers is a function of temperature and time, and the morphology of solder joints is made so as to minimize interfacial and grain boundary energy.

Accordingly, because of the above-described differing properties of solder joints, alloys which have good drop impact performance and a relatively low silver (Ag) content have been developed. However, there are problems in that, because the tin (Sn) content relatively increases with decreases in the silver (Ag) content, the probability to form intermetallic compound layers increases, and the growth of the intermetallic compound layers deteriorate thermal fatigue life, that is, temperature cycle performance, among solder joint reliabilities. In consideration of a current trend in which the use of portable electronic devices is rapidly increasing, the above alloys do not satisfy the demand for products which must satisfy the temperature cycle performance and drop impact performance of solder joints.

SUMMARY OF THE INVENTION

In order to solve the above-described problems occurring in the prior art, the present invention provides a lead-free solder alloy, which simultaneously satisfies temperature cycle performance and drop impact performance, thus improving the reliability of solder joints, when it is applied to substrates treated with nickel (Ni)/gold (Au), printed circuit boards treated with nickel (Ni)/gold (Au), substrates treated with copper (Cu)/OSP, and printed circuit boards treated with copper (Cu)/OSP.

Therefore, it is an object of the present invention to provide a lead-free solder alloy which has a melting point similar to those of prior lead-free solder alloys, excellent wettability, very low segregation ratio and, at the same time, excellent weldability with a welding base metal, thus improving the mechanical strength, thermal strength and drop impact performance of the alloy.

Another object of the present invention is to provide a method of manufacturing a lead-free solder alloy using a high-frequency vacuum induction furnace.

The present inventors have conducted repeated studies to achieve the above objects and, as a result, have found that a lead-free solder alloy, comprising palladium and tellurium together with silver and tin, improves temperature cycle performance and drop impact performance, when it is applied to substrates treated with nickel (Ni)/gold (Au), printed circuit boards treated with nickel (Ni)/gold (Au), substrates treated with copper (Cu)/OSP, and printed circuit boards treated with copper (Cu)/OSP, thereby completing the present invention.

Accordingly, the present invention provides a lead-free solder alloy comprising 0.8-1.2 wt % silver, 0.8-1.2 wt % copper, 0.01-1.0 wt % palladium, 0.001-0.1 wt % tellurium, and the balance of tin.

Silver (Ag) is not toxic in itself and serves to lower the melting point of the alloy, improve the spreadability of a welding base metal and improve temperature cycle performance. Silver (Ag) is preferably contained in an amount of 0.8-1.2 wt % based on total weight (100 wt %) of the lead-free solder alloy of the present invention.

Copper (Cu) serves to improve joint strength, and is preferably contained in an amount of 0.8-1.2 wt % based on total weight (100 wt %) of the lead-free solder alloy of the present invention. If the content thereof is 0.8-1.2 wt %, it is somewhat larger than those of prior lead-free solder alloys, and for this reason, the formation rate of an intermetallic compound of $Cu_6Sn_5$ in a reflow process increases. Thus, the time for substituting copper (Cu) with nickel (Ni) becomes plentiful, compressive stress acts on a bulk solder due to the difference in thermal expansion coefficient between a $(Cu, Ni)_6Sn_5$ intermetallic compound layer and the bulk solder, and a needle-like intermetallic compound is formed. Also, in a copper (Cu)/OSP process, a $Cu_6Sn_5$ compound layer as shown in FIG. 1 is formed, and a $Cu_3Sn$ compound layer as shown in FIG. 2 is formed. Herein, the $Cu_6Sn_5$ compound has hexagonal and rhombohedral structures, and the $Cu_3Sn$ compound has a graphite structure which is weak in a drop impact test.

Palladium (Pd) serves to improve drop impact performance and temperature cycle performance simultaneously, and it binds to α-Sn and β-Sn to form $PdSn_4$, but it is difficult to form the compound, because the production of α-Sn in solders is difficult. Also, it does not form a compound with silver (Ag) because it is a complete solid solution, whereas it forms a $Cu_3Pd$ compound (as shown in FIG. 3) at the interface of a needle-like intermetallic compound having a composition of $(Cu, Ni)_6Sn_5$. The structure of the formed compound is a tetragonal chain structure, and for this reason, the needle-like structure of the intermetallic compound layer becomes denser and forms a chain structure, and it binds to a low-temperature phase α-Sn, produced in a thermal shock condition of temperature ranging from −25° to 125°, and a β-Sn produced in the matrix, thus producing a $PdSn_4$ compound as shown in FIG. 15. As shown in FIG. 15, $PdSn_4$ has a rod-like structure and is present at phase boundaries (particularly, an $Ag_3Sn$ interface) for phase equilibrium. Accordingly, it makes very difficult the progressive propagation of cracks caused by impact and the migration and propagation of cracks produced by thermal fatigue, thus improving drop impact performance and temperature cycle performance.

Palladium (Pd) is preferably contained in an amount of 0.01-1.0 wt % based on the total weight (100 wt %) of the lead-free solder alloy of the present invention.

Tellurium (Te) serves to improve drop impact performance and temperature cycle performance simultaneously and is a complete solid solution which does not form a compound with tin (Sn). Also, it rarely forms a compound with silver (Ag) because it must be present in a content of more than 30 wt % in order to form a compound with silver (Ag). However, it forms a $Cu_2Te$ compound, having a hexagonal structure as shown in FIG. 4, at the interface of a needle-like intermetallic compound having a composition of $(Cu, Ni)_6Sn_5$ or $Cu_6Sn_5$. Due to the formed compound, the needle-like structure of the intermetallic compound layer becomes denser and forms a chain structure, and thus prevents the progressive propagation of cracks caused by impact and the propagation of cracks caused by thermal fatigue, thus providing excellent drop impact performance.

Tellurium (Te) is preferably contained in an amount of 0.001-0.1 wt % based on the total weight (100 wt %) of the lead-free solder alloy of the present invention.

Tin (Sn) is the essential component of the lead-free solder alloy and is used as a base metal. The balance of the lead-free solder alloy of the present invention is composed of tin.

The quinary lead-free solder alloy of the present invention comprising the above-described components, may additionally contain at least one element selected from the group consisting of cobalt (Co), ruthenium (Ru), rhodium (Rh), lanthanum (La), cerium (Ce) and germanium (Ge).

Because at least one element selected from the group consisting of cobalt (Co), ruthenium (Ru), rhodium (Rh), lanthanum (La), cerium (Ce) and germanium (Ge) has a high reactivity to form oxides and consumes a large amount of oxygen during reactions, compared to tin (Sn), it reduces the amount of oxides in the alloy through sacrifice oxidation, thus reducing segregation ratio.

Said at least one element may be contained in an amount of 0.001-0.1 wt % based on the total weight (100 wt %) of the lead-free solder alloy of the present invention. In this regard, particularly, if the content of lanthanum (La), cerium (Ce) and germanium (Ge) exceeds 0.1 wt %, the tendency to react with external oxygen to form oxides becomes greater than the action to reduce oxides in the alloy, thus increasing rather than decreasing the segregation ratio of the alloy.

If two or more elements selected from the above-described group are contained in the alloy, the sum of the contents of the elements is preferably 0.001-0.2 wt %.

Cobalt (Co) does not form a compound with silver (Ag) and copper (Cu), whereas it forms a tetragonal $CoSn_2$ compound (as shown in FIG. 5) with tin (Sn).

Ruthenium (Ru) and rhodium (Rh) are more stable when they form compounds with tin (Sn). Thus, they form a cubic $Ru_3Sn_7$ compound as shown in FIG. 6 and a tetragonal $RhSn_2$ compound as shown in FIG. 5.

The $CoSn_2$, $Ru_3Sn_7$ and $RhSn_2$ compounds are uniformly distributed throughout a solder and reduce interfacial energy in the solder, thus refining grain boundaries. Also, these compounds have a great tendency to refine grain boundaries, compared to lanthanum (La) and cerium (Ce), and thus have better drop impact performance and temperature cycle performance.

Lanthanum (La) and cerium (Ce) are more stable when they form compounds with tin (Sn). Thus, they form cubic $LaSn_3$ and $CeSn_3$ compounds as shown in FIG. 7. Such compounds are uniformly distributed throughout a solder and reduce interfacial energy in the solder, so that they refine grain boundaries, thus increasing mechanical strength and improving drop impact performance and temperature cycle performance simultaneously.

Germanium (Ge) is present as a gel-phase tetragonal structure having the same structural feature as the β-Sn phase in the solder alloy and forms an amorphous-phase $Ge_ySn_{1-y}$ compound (as shown in FIG. 8; y is any real number, which cannot be specified, because the amorphous phase has no regularity in atomic arrangement) when the solder alloy is cooled. Due to the structural characteristics thereof, such a compound prevents the propagation of cracks produced by physical impact and thermal fatigue, thus improving the physical and thermal performance of the solder alloy.

Meanwhile, a method for manufacturing the lead-free solder alloy of the present invention comprises the steps of: (1) preparing a mixture of silver, copper, palladium, tellurium and tin; and (2) introducing the mixture into a high-frequency vacuum induction furnace, in which it is alloyed.

The alloying of step (2) is preferably carried out for 10-minutes, but only after the furnace has first been maintained at a vacuum pressure between $6.0 \times 10^{-1}$ torr and $3.0 \times 10^{-1}$ torr, purged with inert gas at a pressure of 740-750 torr, and then maintained in an inert atmosphere.

When the alloy is manufactured in the vacuum induction furnace as described above, the superfluous reaction between tin with oxygen to form tin oxide ($SnO_2$) is suppressed, while the change in the contents of the other elements is low, thus reducing segregation ratio. Also, the agitation force by electrical eddy current in the vacuum induction furnace is higher than mechanical agitation force of prior methods employing an electric furnace, and the process is not carried out in air, but is carried out in an inert atmosphere, thus further inhibiting segregation.

The lead-free solder alloy according to the present invention has a melting point similar to those of prior lead-free solder alloys, excellent wettability and, at the same time, low segregation ratio. In addition, it has excellent weldability with a welding base metal, such that the mechanical strength, thermal strength and drop impact performance of the alloy can be significantly improved.

Thus, temperature cycle performance and drop impact performance can be simultaneously improved by applying the lead-free solder alloy to electronic devices and printed circuit boards, particularly, substrates treated with Ni/Au, printed circuit boards treated with Ni/Au, substrates treated with Cu/OSP, and printed circuit boards treated with Cu/OSP.

BRIEF DESCRIPTION OF THE DRAWINGS

The above and other objects, features and advantages of the present invention will be more clearly understood from the following detailed description taken in conjunction with the accompanying drawings, in which:

FIG. 1 shows the hexagonal and rhombohedral structures of a $Cu_6Sn_5$ compound;

FIG. 2 shows the graphite structure of a $Cu_3Sn$ compound;

FIG. 3 shows the tetragonal chain structure of a $Cu_3Pd$ compound;

FIG. 4 shows the hexagonal structure of a $Cu_2Te$ compound;

FIG. 5 shows the tetragonal structures of $CoSn_2$ and $RhSn_2$ compounds;

FIG. 6 shows the cubic structure of a $Ru_3Sn_7$ compound;

FIG. 7 shows the cubic structures of $LaSn_3$ and $CeSn_3$ compounds;

FIG. 8 shows the amorphous structure of a $Ge_ySn_{1-y}$ compound;

FIG. 9 shows an oxide generator which is used to measure the amount of oxide generation in the present invention;

FIG. 10 is a graphic diagram showing the relationship between the segregation ratio, workability (yield) and oxide content of an alloy manufactured according to the present invention;

FIG. 11 is a schematic diagram showing a solder joint, which consists of a substrate and printed circuit board which have been surface-treated with nickel (Ni)/gold (Au), an intermetallic compound, and a welding base material;

FIG. 12 is a schematic diagram showing a process in the present invention of forming a solder joint on a substrate and printed circuit board which have been surface-treated with copper (Cu)/OSP;

FIG. 13 specifically shows a method for testing temperature cycle performance in the present invention;

FIG. 14 shows the structure of an $Ag_3Sn$ compound according to the present invention;

FIG. 15 shows the structure of a $PdSn_4$ compound according to the present invention;

FIG. 16 shows the microstructure of joints between substrates and printed circuit boards which have been surface-treated with nickel (Ni)/gold (Au), and solders, according to the present invention, in which (a) in FIG. 16 shows the microstructure of Example 3, (b) shows the microstructure of Example 4, (c) shows the microstructure of Comparative Example 1, and (d) shows the microstructure of Comparative Example 4;

FIG. 17 shows the three-dimensional structures of intermetallic compound layers between substrates and printed circuit boards, which have been surface-treated with nickel (Ni)/gold (Au), and solders, in which (a) in FIG. 17 shows the structure of Example 3, (b) shows the structure of Example 4, (c) shows the structure of Comparative Example 1, and (d) shows the structure of Comparative Example 4;

FIG. 18 and FIG. 19 are graphic diagrams showing drop impact performance, measured using substrates and printed circuit substrates, which have been surface-treated with nickel (Ni)/gold (Au), according to the present invention (FIG. 18 being a Weibull distribution diagram, FIG. 19 being a survival probability diagram);

FIG. 20 shows the microstructures of joints between substrates and printed circuit boards, which have been surface-treated with copper (Cu)-OSP, according to the present invention, in which (a) in FIG. 20 shows the microstructure of Example 3, (b) shows the microstructure of Example 4, (c) shows the microstructure of Comparative Example 1, and (d) shows the microstructure of Comparative Example 4;

FIG. 21 and FIG. 22 are graphic diagrams showing drop impact performance, measured using substrates and printed circuit boards, which have been surface-treated with copper (Cu)-OSP, according to the present invention (FIG. 21 being a Weibull distribution diagram, FIG. 22 being a survival probability diagram); and FIG. 23 and FIG. 24 are graphic diagrams showing temperature cycle performance, measured using substrates and printed circuit boards, which have been surface-treated with copper (Cu)-OSP, according to the present invention (FIG. 23 being a Weibull distribution diagram, FIG. 24 being a survival probability diagram).

DETAILED DESCRIPTION OF THE INVENTION

Hereinafter, preferred examples of the present invention are presented in order to help the understanding of the present invention. It is to be understood, however, that these examples are illustrative only, and various modifications, additions and substitutions are possible without departing from the scope and spirit of the invention as disclosed in the accompanying claims.

EXAMPLES 1 to 13

Manufacture of Lead-Free Solder Alloys in High-Frequency Induction Furnace

Mixtures having the compositions shown in Table 1 (the content of each component is in wt %) were prepared. The prepared mixtures were introduced into a high-frequency vacuum induction furnace, which was then maintained at a degree of vacuum of less than $5.5 \times 10^{-1}$ torr, purged with nitrogen at a pressure of 750 torr and maintained in an inert atmosphere. Then, the mixtures were alloyed for 15 minutes.

TABLE 1

|  | Sn | Ag | Cu | Pd | Te | Co | Ru | Rh | La | Ce | Ge |
| --- | --- | --- | --- | --- | --- | --- | --- | --- | --- | --- | --- |
| Example 1 | Balance | 1.0 | 1.0 | 0.03 | 0.001 | — | — | — | — | — | — |
| Example 2 |  | 1.0 | 1.0 | 0.03 | 0.001 | 0.01 | — | — | — | — | — |
| Example 3 |  | 1.0 | 1.0 | 0.03 | 0.001 | 0.15 | — | — | — | — | — |
| Example 4 |  | 1.0 | 1.0 | 0.03 | 0.001 | — | 0.01 | — | — | — | — |

TABLE 1-continued

| | Sn | Ag | Cu | Pd | Te | Co | Ru | Rh | La | Ce | Ge |
|---|---|---|---|---|---|---|---|---|---|---|---|
| Example 5 | | 1.0 | 1.0 | 0.03 | 0.001 | — | 0.15 | — | — | — | — |
| Example 6 | | 1.0 | 1.0 | 0.03 | 0.001 | — | — | 0.01 | — | — | — |
| Example 7 | | 1.0 | 1.0 | 0.03 | 0.001 | — | — | 0.15 | — | — | — |
| Example 8 | | 1.0 | 1.0 | 0.03 | 0.001 | — | — | — | 0.01 | — | — |
| Example 9 | | 1.0 | 1.0 | 0.03 | 0.001 | — | — | — | 0.15 | — | — |
| Example 10 | | 1.0 | 1.0 | 0.03 | 0.001 | — | — | — | — | 0.01 | — |
| Example 11 | | 1.0 | 1.0 | 0.03 | 0.001 | — | — | — | — | 0.15 | — |
| Example 12 | | 1.0 | 1.0 | 0.03 | 0.001 | — | — | — | — | — | 0.01 |
| Example 13 | | 1.0 | 1.0 | 0.03 | 0.001 | — | — | — | — | — | 0.15 |

EXAMPLES 14 to 20

Manufacture of Lead-Free Solder Alloys in Electric Furnace

Mixtures having the compositions shown in Table 2 (the content of each component is in wt %) were prepared. The mixtures were forcedly agitated in an electric furnace at 1000° C. at an interval of 30 minutes for 4 hours, thus manufacturing alloys.

TABLE 2

| | Sn | Ag | Cu | Pd | Te | Co | Ru | Rh | La | Ce | Ge |
|---|---|---|---|---|---|---|---|---|---|---|---|
| Example 14 | Balance | 1.0 | 1.0 | 0.03 | 0.001 | — | — | — | — | — | — |
| Example 15 | | 1.0 | 1.0 | 0.03 | 0.001 | 0.01 | — | — | — | — | — |
| Example 16 | | 1.0 | 1.0 | 0.03 | 0.001 | — | 0.01 | — | — | — | — |
| Example 17 | | 1.0 | 1.0 | 0.03 | 0.001 | — | — | 0.01 | — | — | — |
| Example 18 | | 1.0 | 1.0 | 0.03 | 0.001 | — | — | — | 0.01 | — | — |
| Example 19 | | 1.0 | 1.0 | 0.03 | 0.001 | — | — | — | — | 0.01 | — |
| Example 20 | | 1.0 | 1.0 | 0.03 | 0.001 | — | — | — | — | — | 0.01 |

COMPARATIVE EXAMPLES 1 to 7

Mixtures having the compositions shown in Table 3 (the content of each component is in wt %) were prepared. The prepared mixtures were introduced into a high-frequency vacuum induction furnace, which was then maintained at a degree of vacuum of less than $5.5 \times 10^{-1}$ torr, purged with nitrogen at a pressure of 750 torr and then maintained in an inert atmosphere, following which the mixtures were alloyed for 15 minutes.

TABLE 3

| | Sn | Ag | Cu | Ni | Pb |
|---|---|---|---|---|---|
| Comparative Example 1 | Balance | 1.0 | 0.5 | — | — |
| Comparative Example 2 | | 1.0 | 0.7 | — | — |
| Comparative Example 3 | | 1.0 | 1.0 | — | — |
| Comparative Example 4 | | 3.0 | 0.5 | — | — |
| Comparative Example 5 | | 4.0 | 0.5 | — | — |
| Comparative Example 6 | | 1.2 | 0.5 | 0.05 | — |
| Comparative Example 7 | | — | — | — | 37 |

The alloys manufactured as described above were tested for physical properties in the following manners.

Measurement of Segregation Ratio

Each of the alloys manufactured in Examples 1-13 and Examples 14-20 was used to prepare three solder bars which were 15 mm in width, 255 mm in length and 15 mm in height. Each of the prepared solder bars was divided into five equal parts, the contents of the main components (silver (Ag), copper (Cu), palladium (Pd) and tellurium (Te)) were analyzed with a spectrometer, and the segregation ratio was calculated as the average of analyzed values relative to fed amounts for each component according to the following equation 1. The test results of segregation ratio are shown in Table 4.

$$\text{Segregation ratio}(\%) = [\{100 - (\text{analyzed value}_{x1}/\text{fed amount}_{x1}) \times 100\} + \{100 - (\text{analyzed value}_{x2}/\text{fed amount}_{x2}) \times 100\} + \cdots + \{100 - (\text{analyzed value}_{xn}/\text{fed amount}_{xn}) \times 100\}]/n \quad \text{[Equation 1]}$$

wherein subscripts x1 to xn indicate a divided solder bar. For example, x1 the first portion of a solder bar divided by n, and x2 is the second portion of a solder bar divided by n.

TABLE 4

| | Manufacturing method | Composition | Segregation ratio (%) |
|---|---|---|---|
| Example 1 | High-frequency vacuum induction furnace | Sn1.0Ag1.0Cu0.03Pd0.001Te | 0.9 |
| Example 2 | | Sn1.0Ag1.0Cu0.03Pd0.001Te0.01Co | 1.9 |
| Example 3 | | Sn1.0Ag1.0Cu0.03Pd0.001Te0.15Co | 2.0 |
| Example 4 | | Sn1.0Ag1.0Cu0.03Pd0.001Te0.01Ru | 0.2 |
| Example 5 | | Sn1.0Ag1.0Cu0.03Pd0.001Te0.15Ru | 2.0 |
| Example 6 | | Sn1.0Ag1.0Cu0.03Pd0.001Te0.01Rh | 0.3 |

TABLE 4-continued

| | Manufacturing method | Composition | Segregation ratio (%) |
|---|---|---|---|
| Example 7 | | Sn1.0Ag1.0Cu0.03Pd0.001Te0.15Rh | 2.2 |
| Example 8 | | Sn1.0Ag1.0Cu0.03Pd0.001Te0.01La | 0.4 |
| Example 9 | | Sn1.0Ag1.0Cu0.03Pd0.001Te0.15La | 5.1 |
| Example 10 | | Sn1.0Ag1.0Cu0.03Pd0.001Te0.01Ce | 0.5 |
| Example 11 | | Sn1.0Ag1.0Cu0.03Pd0.001Te0.15Ce | 5.5 |
| Example 12 | | Sn1.0Ag1.0Cu0.03Pd0.001Te0.01Ge | 1.1 |
| Example 13 | | Sn1.0Ag1.0Cu0.03Pd0.001Te0.15Ge | 6.3 |
| Example 14 | Electric furnace | Sn1.0Ag1.0Cu0.03Pd0.001Te | 11.5 |
| Example 15 | | Sn1.0Ag1.0Cu0.03Pd0.001Te0.01Co | 11.2 |
| Example 16 | | Sn1.0Ag1.0Cu0.03Pd0.001Te0.01Ru | 12.7 |
| Example 17 | | Sn1.0Ag1.0Cu0.03Pd0.001Te0.01Rh | 12.3 |
| Example 18 | | Sn1.0Ag1.0Cu0.03Pd0.001Te0.01La | 7.6 |
| Example 19 | | Sn1.0Ag1.0Cu0.03Pd0.001Te0.01Ce | 8.1 |
| Example 20 | | Sn1.0Ag1.0Cu0.03Pd0.001Te0.01Ge | 8.3 |

As shown in Table 4 above, the difference in segregation ratio was clear depending on the methods for manufacturing the lead-free solder alloys and the additional elements. First, the alloys of Examples 1-13 manufactured in the high-frequency vacuum induction furnace showed a decrease in segregation ratio of more than about 50% compared to the alloys of Examples 14-20 prepared in the electric furnace. Namely, a superfluous reaction of tin with oxygen to form tin oxide ($SnO_2$) was inhibited, while the change in the contents of the other elements was low, leading to a decrease in segregation ratio.

Moreover, in the alloys containing 0.1 wt % of each of ruthenium (Ru), rhodium (Rh), lanthanum (La), cerium (Ce) and germanium (Ge), the alloys of Examples 2, 4, 6, 8, 10 and 12 manufactured in the high-frequency vacuum induction furnace showed a decrease in segregation ratio of about 100%, and the alloys of Examples 15-20 manufactured in the electric furnace showed a decrease in segregation ratio of about 20%. However, in the case of Examples 3, 5, 7, 9, 11 and 13 containing 0.15 wt % of each of each of ruthenium (Ru), rhodium (Rh), lanthanum (La), cerium (Ce) and germanium (Ge), the tendency to react with external oxygen to form oxides was greater than the action to reduce oxides in the alloys, leading to a small increase in segregation ratio.

Accordingly, it can be seen that it is preferable to manufacture alloys using the high-frequency vacuum induction furnace and it is more preferable to add each of ruthenium (Ru), rhodium (Rh), lanthanum (La), cerium (Ce) and germanium (Ge) in an amount of 0.001-0.1 wt %.

Evaluation of Workability (Yield) in the Manufacture of Solder Balls

In order to evaluate workability in the manufacture of solder balls for the alloys manufactured in Examples 1-13 and Examples 14-20, the solder bars used in the measurement of segregation ratio were used. Using a pulsated atomization process (PAP), 1000 g of each of the alloys was sprayed through a nozzle having a diameter of 0.2 mm, thus preparing a solder ball having a diameter of 0.45±0.01 mm. Yield was calculated based on the weight of the prepared solder balls, and the calculated results are shown in Table 5 below.

TABLE 5

| | Manufacturing method | Composition | Ball size (mm) | Yield (%) |
|---|---|---|---|---|
| Example 1 | High-frequency vacuum induction furnace | Sn1.0Ag1.0Cu0.03Pd0.001Te | 0.45 | 89.2 |
| Example 2 | | Sn1.0Ag1.0Cu0.03Pd0.001Te0.01Co | | 87.5 |
| Example 3 | | Sn1.0Ag1.0Cu0.03Pd0.001Te0.15Co | | 93.6 |
| Example 4 | | Sn1.0Ag1.0Cu0.03Pd0.001Te0.01Ru | | 85.9 |
| Example 5 | | Sn1.0Ag1.0Cu0.03Pd0.001Te0.15Ru | | 87.2 |
| Example 6 | | Sn1.0Ag1.0Cu0.03Pd0.001Te0.01Rh | | 91.1 |
| Example 7 | | Sn1.0Ag1.0Cu0.03Pd0.001Te0.15Rh | | 88.2 |
| Example 8 | | Sn1.0Ag1.0Cu0.03Pd0.001Te0.01La | | 90.5 |
| Example 9 | | Sn1.0Ag1.0Cu0.03Pd0.001Te0.15La | | 75.9 |
| Example 10 | | Sn1.0Ag1.0Cu0.03Pd0.001Te0.01Ce | | 91.6 |
| Example 11 | | Sn1.0Ag1.0Cu0.03Pd0.001Te0.15Ce | | 79.5 |
| Example 12 | | Sn1.0Ag1.0Cu0.03Pd0.001Te0.01Ge | | 90.1 |
| Example 13 | | Sn1.0Ag1.0Cu0.03Pd0.001Te0.15Ge | | 76.8 |
| Example 14 | Electric furnace | Sn1.0Ag1.0Cu0.03Pd0.001Te | | 70.2 |
| Example 15 | | Sn1.0Ag1.0Cu0.03Pd0.001Te0.01Co | | 71.0 |
| Example 16 | | Sn1.0Ag1.0Cu0.03Pd0.001Te0.01Ru | | 68.2 |
| Example 17 | | Sn1.0Ag1.0Cu0.03Pd0.001Te0.01Rh | | 69.8 |
| Example 18 | | Sn1.0Ag1.0Cu0.03Pd0.001Te0.01La | | 78.2 |
| Example 19 | | Sn1.0Ag1.0Cu0.03Pd0.001Te0.01Ce | | 77.5 |
| Example 20 | | Sn1.0Ag1.0Cu0.03Pd0.001Te0.01Ge | | 75.5 |

As shown in Table 5, it was observed that the segregation ratio and oxide content in the manufacture of the alloys influenced the total solder ball manufacture yield. First, the alloys of Examples 1-13 manufactured in the high-frequency vacuum induction furnace showed an approximate increase in yield of more than 20% compared to the alloys of Examples 14-20 manufactured in the electric furnace.

Moreover, when ruthenium (Ru), rhodium (Rh), lanthanum (La), cerium (Ce) and germanium (Ge) were added, workability, that is yield, could be increased, but when each of the elements exceeded 0.1 wt %, nozzle clogging occurred due to the increase in segregation ratio together with the increase in oxide content in the molten lead-free solder alloys, leading to a decreased yield of solder balls. There was a correlation between the results of the segregation ratio tests and the manufacturing yield of solder balls, and it can be seen that the segregation ratio of the alloys, the content of the remaining oxide, and the yield of solder balls were proportional to each other.

Measurement of the Amount of Oxides Generated

The generation of oxides, acting as an important factor in segregation ratio and workability, was examined to test a direct correlation with segregation ratio and workability.

The alloys manufactured in Examples 1-13 and Comparative Example 3 were melted in air at a temperature of 245±5° C., and 2 kg of an analysis sample for each of the melted alloys was mechanically agitated at 100 rpm. In order to maximize the agitation force, the agitation was performed at a location of ¼ of an agitation tank. Using an oxide generator shown in FIG. 9, the contents of oxides produced on the surface of the agitated alloys were measured at varying points of time, and the measurement results are shown in Table 6 below.

TABLE 6

| | Composition | Oxide content (g) | | | |
|---|---|---|---|---|---|
| | | 30 min | 60 min | 90 min | 120 min |
| Example 1 | Sn1.0Ag1.0Cu0.03Pd0.001Te | 55 | 81 | 102 | 147 |
| Example 2 | Sn1.0Ag1.0Cu0.03Pd0.001Te0.01Co | 99 | 121 | 145 | 196 |
| Example 3 | Sn1.0Ag1.0Cu0.03Pd0.001Te0.15Co | 102 | 118 | 158 | 200 |
| Example 4 | Sn1.0Ag1.0Cu0.03Pd0.001Te0.01Ru | 15 | 24 | 38 | 61 |
| Example 5 | Sn1.0Ag1.0Cu0.03Pd0.001Te0.15Ru | 90 | 117 | 162 | 198 |
| Example 6 | Sn1.0Ag1.0Cu0.03Pd0.001Te0.01Rh | 16 | 23 | 42 | 62 |
| Example 7 | Sn1.0Ag1.0Cu0.03Pd0.001Te0.15Rh | 100 | 130 | 171 | 201 |
| Example 8 | Sn1.0Ag1.0Cu0.03Pd0.001Te0.01La | 19 | 25 | 45 | 63 |
| Example 9 | Sn1.0Ag1.0Cu0.03Pd0.001Te0.15La | 160 | 188 | 230 | 299 |
| Example 10 | Sn1.0Ag1.0Cu0.03Pd0.001Te0.01Ce | 20 | 28 | 44 | 68 |
| Example 11 | Sn1.0Ag1.0Cu0.03Pd0.001Te0.15Ce | 158 | 190 | 220 | 280 |
| Example 12 | Sn1.0Ag1.0Cu0.03Pd0.001Te0.01Ge | 24 | 32 | 50 | 72 |
| Example 13 | Sn1.0Ag1.0Cu0.03Pd0.001Te0.15Ge | 161 | 192 | 250 | 300 |
| Comparative Example 1 | Sn1.0Ag1.0Cu | 140 | 175 | 192 | 228 |

As shown in Table 6, it can be seen that the contents of oxides were proportional to segregation ratios. Moreover, when ruthenium (Ru), rhodium (Rh), lanthanum (La), cerium (Ce) and germanium (Ge) were added, they acted as a tin oxidation barrier to reduce the consumption of oxygen, and they reduced the contents of oxides in the alloys through sacrificial oxidation because they have a reactivity greater than that of tin.

However, in the case of the alloys of Examples 3, 5, 7, 9, and 13 containing 0.15 wt % of each of ruthenium (Ru), rhodium (Rh), lanthanum (La), cerium (Ce) and germanium (Ge), the tendency to react with external oxide to form oxides was greater than the action to reduce oxides in the alloys, leading to an increase in the oxide contents.

If elements, such as ruthenium (Ru), rhodium (Rh), lanthanum (La), cerium (Ce) and germanium (Ge) are additionally added, each of the elements is preferably added in an amount of 0.001-0.1 wt %.

FIG. 10 shows the correlation between segregation ratio, workability (yield) and oxide content obtained in the above-described tests of the three physical properties. As shown therein, segregation ratio, workability (yield) and oxide content are highly proportional to each other.

Evaluation of Wettability

In order to evaluate the solder joint reliabilities of the lead-free solder alloys manufactured in Examples 1-13 and Comparative Examples 1-6, the wettability and melting point of the alloys were measured in the following manner, and the measurement results are shown in Table 7 below.

Using 3×10×0.3 mm specimens (copper coupons) surface-treated with OSP, wettability was measured a total of 10 times in accordance with the J-STD-0028 standard using a water-soluble flux at a molten metal temperature of 245±5° C., and the measurements were averaged. More specifically, the wettability test was performed by measuring wetting force according to wetting time using the meniscograph method. In the wettability test, the specimen was immersed in a molten solder bath, heated to 245±5° C., at a given speed to a given depth, the buoyancy and wetting force (force acting on the specimen by surface tension after the initiation of wetting) applied to the specimen were measured, and the acting force and time curve were analyzed and evaluated. The maximum wetting force was calculated according to the following Equation 2. Herein, the wetting time ($T_0$) indicates the time in which the molten solder is wetted on the specimen while it becomes horizontal to the specimen. It is a state in which buoyancy and the surface tension of the molten solder equilibrate with each other, and it is an important factor for determining wettability.

$$\text{Maximum wetting force}(F_{max}) = p y \cos \theta_c - \rho g V_b. \quad [\text{Equation 2}]$$

wherein p is the circumference of the immersed specimen, y is the surface tension of the solder coming into contact with the flux, $\theta_c$, is a contact angle, $V_b$, is a immersed volume, and g is gravity acceleration.

Melting point was measured using 10 mg of an analysis sample in an aluminum crucible (volume: 25 μl, and diameter: 5 mm) using a differential scanning calorimeter (DSC).

TABLE 7

| | Composition | Mp (° C.) | Fmax (mN) | $T_0$ (sec) |
|---|---|---|---|---|
| Example 1 | Sn1.0Ag1.0Cu0.03Pd0.001Te | 217.8 | 2.191 | 1.4 |
| Example 2 | Sn1.0Ag1.0Cu0.03Pd0.001Te0.01Co | 218.5 | 2.178 | 1.0 |
| Example 3 | Sn1.0Ag1.0Cu0.03Pd0.001Te0.15Co | 219.0 | 2.203 | 1.9 |

TABLE 7-continued

| | Composition | Mp (° C.) | Fmax (mN) | $T_0$ (sec) |
|---|---|---|---|---|
| Example 4 | Sn1.0Ag1.0Cu0.03Pd0.001Te0.01Ru | 218.1 | 2.198 | 0.6 |
| Example 5 | Sn1.0Ag1.0Cu0.03Pd0.001Te0.15Ru | 218.5 | 2.220 | 1.5 |
| Example 6 | Sn1.0Ag1.0Cu0.03Pd0.001Te0.01Rh | 217.9 | 2.207 | 0.8 |
| Example 7 | Sn1.0Ag1.0Cu0.03Pd0.001Te0.15Rh | 218.2 | 2.250 | 1.8 |
| Example 8 | Sn1.0Ag1.0Cu0.03Pd0.001Te0.01La | 217.8 | 2.230 | 0.9 |
| Example 9 | Sn1.0Ag1.0Cu0.03Pd0.001Te0.15La | 218.0 | 2.186 | 1.7 |
| Example 10 | Sn1.0Ag1.0Cu0.03Pd0.001Te0.01Ce | 218.3 | 2.208 | 0.8 |
| Example 11 | Sn1.0Ag1.0Cu0.03Pd0.001Te0.15Ce | 218.2 | 2.222 | 1.9 |
| Example 12 | Sn1.0Ag1.0Cu0.03Pd0.001Te0.01Ge | 218.1 | 2.162 | 1.4 |
| Example 13 | Sn1.0Ag1.0Cu0.03Pd0.001Te0.15Ge | 218.0 | 2.161 | 1.8 |
| Comparative Example 1 | Sn1.0Ag0.5Cu | 218.2 | 2.248 | 1.5 |
| Comparative Example 2 | Sn1.0Ag0.7Cu | 218.3 | 2.238 | 1.7 |
| Comparative Example 3 | Sn1.0Ag1.0Cu | 218.2 | 2.223 | 1.8 |
| Comparative Example 4 | Sn3.0Ag0.5Cu | 217.5 | 2.284 | 1.5 |
| Comparative Example 5 | Sn4.0Ag0.5Cu | 217.4 | 2.201 | 1.6 |
| Comparative Example 6 | Sn1.2Ag0.5Cu0.05Ni | 218.2 | 2..185 | 1.9 |
| Comparative Example 7 | 63Sn37Pb | 183.1 | 2.308 | 0.5 |

As shown in Table 7 above, except for Comparative Example 7 the melting point showed no significant difference between Examples and Comparative Examples, but the wetting time ($T_0$) in the evaluation of wettability had a significant difference between the alloys. Specifically, the alloy of Comparative Example 7 containing lead (Pb) showed a wetting time of 0.5 sec, which was 0.2-0.4 sec shorter than those of the alloys of Examples 1, 2, 4, 6, 8, 10 and 12. However, in the case of the alloys further containing at least one element together with palladium (Pd) and tellurium (Te), the wetting time was improved by at least 50%. Particularly, the alloys containing ruthenium (Ru) showed a more improved wetting time, and this is because the surface tension of the molten solder and the interfacial energy between the solder and the flux decreased and the production of oxide layers was inhibited. However, the wettability had no correlation with the wetting time as shown in equation 2, and it is considered that there was no significant difference between the wettability values in view of the averages of 10 measurements.

Evaluation of Drop Impact Performance

The drop impact performance of the lead-free solder alloys manufactured in Examples 1, 2, 4, 6, 8, 10 and 12 and Comparative Examples 1-6 was evaluated in the following manner, and the evaluation results are shown in Tables 8 and 9 below.

The drop impact performance was measured in accordance with the JEDEC Standard JESD22-B111 using a drop impact tester at a peak acceleration of (G) of 1500±150 G and a pulse duration of 0.5 msec. The number of drops was limited to a maximum of 300, and as substrates and printed circuit boards (PCBs) used in the evaluation of drop test performance, those whose surfaces have been treated with nickel (Ni)/gold (Au) and those whose surfaces have been treated with copper (Cu)/OSP were used.

TABLE 8

| | | Surface treatment | | | 5% | 10% | 63.2% |
|---|---|---|---|---|---|---|---|
| | Composition | Substrate | PCB | 1% failure | failure | failure | failure |
| Example 1 | Sn1.0Ag1.0Cu0.03Pd0.001Te | Ni/Au | Ni/Au | 210 | 243 | 260 | 319 |
| Example 2 | Sn1.0Ag1.0Cu0.03Pd0.001Te0.01Co | | | 212 | 263 | 289 | 390 |
| Example 3 | Sn1.0Ag1.0Cu0.03Pd0.001Te0.01Ru | | | 220 | 279 | 310 | 430 |
| Example 4 | Sn1.0Ag1.0Cu0.03Pd0.001Te0.01Rh | | | 216 | 294 | 336 | 511 |
| Example 5 | Sn1.0Ag1.0Cu0.03Pd0.001Te0.01La | | | 212 | 250 | 269 | 337 |
| Example 6 | Sn1.0Ag1.0Cu0.03Pd0.001Te0.01Ce | | | 210 | 250 | 270 | 343 |
| Example 7 | Sn1.0Ag1.0Cu0.03Pd0.001Te0.01Ge | | | 212 | 252 | 272 | 345 |
| Comparative Example 1 | Sn1.0Ag0.5Cu | | | 25 | 59 | 86 | 279 |
| Comparative Example 2 | Sn1.0Ag0.7Cu | | | 15 | 41 | 63 | 244 |
| Comparative Example 3 | Sn1.0Ag1.0Cu | | | 32 | 70 | 98 | 282 |
| Comparative Example 4 | Sn3.0Ag0.5Cu | | | 11 | 28 | 43 | 156 |
| Comparative Example 5 | Sn4.0Ag0.5Cu | | | 10 | 26 | 39 | 134 |
| Comparative Example 6 | Sn1.2Ag0.5Cu0.05Ni | | | 5 | 20 | 35 | 198 |

As shown in FIG. 8, in the case of the substrates and printed circuit boards whose surfaces were treated with nickel (Ni)/gold (Au), the drop impact performance of the alloys of Examples was improved by about 250%, as can be seen by comparing the number of initial failures for the alloys of Examples with the alloys of Comparative Examples. The rapid improvement in drop impact performance has a close connection with the morphology of solder joints. FIG. 11 shows a solder joint consisting of a substrate and printed circuit board whose surfaces have been treated with nickel (Ni)/gold (Au), an intermetallic compound and a welding base metal.

Drop impact performance is greatly influenced by the morphology of solder joints, and the microstructures of Examples 3 and 4 and Comparative Examples 1 and 4, i.e. those having the most excellent drop impact performance in the above results, are shown in FIG. 16. With respect to the morphology of solder joints, in the case of the alloys of Examples, the content of copper is about two-fold higher than that of the alloys of Comparative Examples, and thus the formation rate of an intermetallic compound of $(Cu, Ni)_6Sn_5$ due to the internal diffusion of copper (Cu) and nickel (Ni) after the formation of an intermetallic compound of $Cu_6Sn_5$ in the reflow process increases. Accordingly, the time for substitution of copper (Cu) with nickel (Ni) becomes longer, compressive stress acts on the bulk solder due to the difference between a $(Cu, Ni)_6Sn_5$ intermetallic compound layer and the bulk solder, and the intermetallic compound has a needle-like structure.

Palladium (Pd) and tellurium (Te) form $Cu_3Pd$ and $Cu_2Te$ phases at the unstable interface of a needle-like intermetallic compound of $(Cu, Ni)_6Sn_5$. The formed $Cu_3Pd$ has a tetragonal chain structure, the formed $Cu_2Te$ has a hexagonal structure, and due to such structures, the needle-like structure of the intermetallic compound layer becomes denser and forms a chain structure. FIG. 17 shows the three-dimensional structures of the intermetallic compound layers of Examples 3 and 4 and Comparative Examples 1 and 4. Accordingly, in the alloys of the Examples, the progressive propagation of cracks caused by impact becomes difficult, and thus the alloys of the Examples have very excellent drop impact performance compared to the solder alloys of Comparative Examples.

Furthermore, cobalt (Co) forms tetragonal $CoSn_2$, and ruthenium (Ru) and rhodium (Rh) form cubic $Ru_3Sn_7$ and tetragonal $RhSn_2$ compounds, respectively. Moreover, lanthanum (La) and cerium (Ce) form cubic $LaSn_3$ and $CeSn_3$, respectively, and germanium (Ge) forms a tetragonal compound. The alloys of Examples containing such elements have increased strength due to the effect of refining grain boundaries, and thus have excellent drop impact performance. The increase in the strength of the alloys due to the refinement of grain boundaries is shown in equation 3 below.

The results shown in Table 8 above were expressed as a Weibull distribution (FIG. 18) and survival probability (FIG. 19).

$$\text{Strength}(\sigma_y) \text{ of material} = \sigma_i + k_y \times d^{-1/2} \quad \text{[Equation 3]}$$

wherein ($\sigma_{r_y}$ is the average strength of a grain boundary, $k_y$ is a composite parameter that determines the effect of the grain boundary on the increase in the strength of material, and d is the size of the grain boundary.

TABLE 9

| | Composition | Surface treatment | | 1% failure | 5% failure | 10% failure | 63.2% failure |
| --- | --- | --- | --- | --- | --- | --- | --- |
| | | Substrate | PCB | | | | |
| Example 1 | Sn1.0Ag1.0Cu0.03Pd0.001Te | Cu/OSP | Cu/OSP | 66 | 112 | 142 | 295 |
| Example 2 | Sn1.0Ag1.0Cu0.03Pd0.001Te0.01Co | | | 66 | 113 | 143 | 299 |
| Example 3 | Sn1.0Ag1.0Cu0.03Pd0.001Te0.01Ru | | | 74 | 129 | 165 | 357 |
| Example 4 | Sn1.0Ag1.0Cu0.03Pd0.001Te0.01Rh | | | 76 | 134 | 172 | 378 |
| Example 5 | Sn1.0Ag1.0Cu0.03Pd0.001Te0.01La | | | 68 | 120 | 153 | 332 |
| Example 6 | Sn1.0Ag1.0Cu0.03Pd0.001Te0.01Ce | | | 69 | 114 | 141 | 279 |
| Example 7 | Sn1.0Ag1.0Cu0.03Pd0.001Te0.01Ge | | | 66 | 114 | 145 | 306 |
| Comparative Example 1 | Sn1.0Ag0.5Cu | | | 39 | 68 | 87 | 186 |
| Comparative Example 2 | Sn1.0Ag0.7Cu | | | 33 | 63 | 85 | 211 |
| Comparative Example 3 | Sn1.0Ag1.0Cu | | | 46 | 87 | 115 | 276 |
| Comparative Example 4 | Sn3.0Ag0.5Cu | | | 16 | 36 | 51 | 155 |
| Comparative Example 5 | Sn4.0Ag0.5Cu | | | 11 | 26 | 38 | 121 |
| Comparative Example 6 | Sn1.2Ag0.5Cu0.05Ni | | | 36 | 74 | 102 | 274 |

As shown in Table 9 above, it could be seen from the number of initial failures (1% failures) that, in the case of the substrates and printed circuit boards whose surfaces have been treated with copper (Cu)/OSP, the drop impact performance of the alloys of the Examples was improved by about 100% compared to the alloys of the Comparative Examples. Like the tests of the substrates and printed circuit boards whose surfaces have been treated with nickel (Ni)/gold (Au), the drop impact performance in the substrates whose surfaces have been treated with copper (Cu)/OSP has a close connection with the morphology of solder joints. FIG. 12 shows a process of forming a solder joint on a substrate and printed circuit board whose surfaces have been treated with copper (Cu)/OSP.

As shown in FIG. 12, if the substrate and the printed circuit board are surface-treated with copper (Cu)/OSP, an intermetallic compound of $Cu_6Sn_5$ is produced. Herein, due to the difference in thermal expansion coefficient between the intermetallic compound layer of $Cu_6Sn_5$ and the bulk solder, compressive stress acts on the bulk solder, but the morphology of the intermetallic compound has a scallop structure, unlike the case of surface treatment with nickel (Ni)/gold (Au), because the content of copper (Cu) is relatively high compared to the case of surface treatment with nickel (Ni)/gold (Au). Due to a relatively large copper (Cu) content as suggested in the present invention, a second intermetallic compound layer is produced through a reflow process. Specifically, two intermetallic compound layers having the two compositions of $Cu_6Sn_5$ and $Cu_3Sn$ are formed. Herein, copper (Cu) remaining after forming the first intermetallic compound layer of $Cu_6Sn_5$ forms a $Cu_3Sn$ compound layer (a thermodynamically stable second intermetallic compound layer) with tin (Sn) by diffusion. $Cu_6Sn_5$ has hexagonal and rhombohedral structures, but $Cu_3Sn$ has a graphite structure, which is structurally very weak, and thus is very weak in drop impact tests.

Such structural defects can be solved by adding palladium (Pd) and tellurium (Te). Such elements inhibit copper (Cu) remaining after forming the first intermetallic layer of $Cu_6Sn_5$ from forming a $Cu_3Sn$ compound layer, which is a thermodynamically stable second intermetallic compound layer, so as to suppress the breakdown by the $Cu_3Sn$ layer by drop impact, thus improving drop impact performance.

Furthermore, compounds ($CoSn_2$, $Ru_3Sn_7$, $RhSn_2$, $LaSn_3$, and $CeSn_3$) formed by the addition of cobalt (Co), ruthenium (Ru), rhodium (Rh), lanthanum (La) and cerium (Ce), when uniformly distributed at the surface of the bulk solder and the intermetallic compound layer, interfere with the diffusion of tin (Sn), thus inhibiting copper (Cu) remaining after forming the first intermetallic compound layer from forming a $Cu_3Sn$ compound layer, which is a thermodynamically stable second intermetallic layer. Germanium (Ge) forms a tetragonal compound, which interferes with the propagation of cracks due to the structural properties thereof, thus improving the mechanical performance of the alloy. The microstructures of Examples 3 and 4 and Comparative Examples 1 and 4, which show the most excellent drop impact performance, are shown in FIG. 20.

The results in Table 9 above were expressed as a Weibull distribution (FIG. 21) and survival probability (FIG. 22).

Evaluation of Temperature Cycle Performance

Temperature cycle performance on the substrates and printed circuit boards whose surfaces have been treated with copper (Cu)/OSP, which have poor temperature cycle performance, was evaluated in the following manner, and the evaluation results are shown in Table 10 below.

Real-time resistance was measured using a thermal shock tester at a temperature ranging from −25° C. to 125° C., and the test conditions are shown in FIG. 13.

(a thermodynamically stable second intermetallic layer) with tin (Sn) by diffusion. Also, the $Ag_3Sn$ compound of FIG. 14, distributed in the bulk solder, grows by heat, and the growth of $Ag_3Sn$ is remarkable in the case of Comparative Examples 3 and 4 having relatively high silver (Ag) contents. Based on the growth mechanism of such a compound, the properties of the lead-free solder alloys according to the present invention will now be explained.

When palladium (Pd) and tellurium (Te) are added, they form a $Cu_3Pd$ compound and a $Cu_2Te$ compound at the unstable interface of the intermetallic compound of $Cu_6Sn_5$. The addition of palladium (Pd) and tellurium (Te) interferes with the formation and growth of a $Cu_3Sn$ compound layer, which tends to propagate cracks caused by thermal fatigue. Also, palladium (Pd) binds to a low-temperature phase α-Sn, produced at a temperature ranging from −25° C. to 125° C., and a β-Sn phase, already produced in the base, to produce a $PdSn_4$ compound as shown in FIG. 15. As shown in FIG. 15, $PdSn_4$ has a rod-like structure and is present at phase boundaries (particularly, an $Ag_3Sn$ interface) for phase equilibrium. It inhibits cracks produced by thermal fatigue from migrating and propagating through phase boundaries, such that the alloy has excellent temperature cycle performance.

Moreover, compounds ($CoSn_2$, $Ru_3Sn$, and $RhSn_2$) formed by the addition of cobalt (Co), ruthenium and rhodium (Rh) are uniformly distributed in the bulk solder and the interface of the intermetallic compound layer by growth and diffusion at a temperature ranging from −25° C. to 125° C. to reduce interfacial energy, thus more refining the grain boundary in

TABLE 10

| | Composition | Surface treatment | | 1% failure | 10% failure | 63.2% failure |
| | | Substrate | PCB | | | |
|---|---|---|---|---|---|---|
| Example 1 | Sn1.0Ag1.0Cu0.03Pd0.001Te | Cu/OSP | Cu/OSP | 616 | 896 | 1282 |
| Example 2 | Sn1.0Ag1.0Cu0.03Pd0.001Te0.01Co | | | 650 | 917 | 1276 |
| Example 3 | Sn1.0Ag1.0Cu0.03Pd0.001Te0.01Ru | | | 697 | 958 | 1299 |
| Example 4 | Sn1.0Ag1.0Cu0.03Pd0.001Te0.01Rh | | | 637 | 927 | 1329 |
| Example 5 | Sn1.0Ag1.0Cu0.03Pd0.001Te0.01La | | | 676 | 958 | 1337 |
| Example 6 | Sn1.0Ag1.0Cu0.03Pd0.001Te0.01Ce | | | 675 | 947 | 1310 |
| Example 7 | Sn1.0Ag1.0Cu0.03Pd0.001Te0.01Ge | | | 691 | 958 | 1310 |
| Comparative Example 1 | Sn1.0Ag0.5Cu | | | 301 | 572 | 1057 |
| Comparative Example 2 | Sn1.0Ag0.7Cu | | | 379 | 662 | 1128 |
| Comparative Example 3 | Sn1.0Ag1.0Cu | | | 412 | 688 | 1124 |
| Comparative Example 4 | Sn3.0Ag0.5Cu | | | 602 | 889 | 1293 |
| Comparative Example 5 | Sn4.0Ag0.5Cu | | | 635 | 913 | 1293 |
| Comparative Example 6 | Sn1.2Ag0.5Cu0.05Ni | | | 134 | 636 | 942 |

As shown in Table 10 above, the alloys having relatively low silver (Ag) content showed very poor temperature cycle performance. However, the alloys of the Examples showed temperature cycle performance equal or higher than the alloys of Comparative Examples 4 and 5, even though they had relatively low silver contents.

The breakdown of material by thermal shock occurs due to the propagation of micro-cracks in the intermetallic compound layer, grown at a temperature from −25° C. to 125° C., and the bulk solder. As described above with respect to drop impact performance, if the substrate and the printed circuit substrate are surface-treated with copper (Cu)/OSP, two intermetallic compound layers of $Cu_6Sn_5$ and $Cu_3Sn$ are formed. Specifically, copper (Cu) remaining after forming the first intermetallic layer of $Cu_6Sn_5$ forms a $Cu_3Sn$ compound layer the solder alloy. Also, these compounds are uniformly distributed in the bulk solder and the interface of the intermetallic compound layer to prevent the diffusion of tin (Sn), such that they interfere with the growth of a $Cu_3Sn$ compound, which tends to propagate cracks, thus inhibiting the breakdown of the $Cu_3Sn$ compound layer by thermal fatigue.

As described above, due to the combination with palladium (Pd), the structure of $Cu_6Sn_5$, $Cu_3Sn$ and $Ag_3Sn$ compounds maintains a rod-like structure, such that the growth of the $Cu_6Sn_5$, $Cu_3Sn$ and $Ag_3Sn$ compounds having high surface energy is effectively controlled, and thus the alloy has very excellent temperature cycle performance.

Also, when lanthanum (La), cerium (Ce) and germanium (Ge), which have high surface activation ability, are added, they are adsorbed onto the interface of the intermetallic compounds of $Cu_6Sn_5$ and $Ag_3Sn$ having high surface energy. The adsorption of the elements having high surface activation ability varies depending on each plane (orientation plane of crystal). A plane having the highest surface tension grows most rapidly, and the adsorption of the surface-activating elements reaches the maximum. The adsorption of the surface-activating elements is very important in minimizing free energy, and such adsorption reduces the difference in surface energy of crystals and prevents excessive growth of planes having high surface energy. Accordingly, the addition of lanthanum (La), cerium (Ce) and germanium (Ge), which have high activation ability, reduces the size of intermetallic compounds of $Cu_6Sn_5$ and $Ag_3Sn$ and also reduces the size of particle size of the matrix phase β-Sn. Due to such structural properties, they interfere with the propagation of cracks, thus contributing to the improvement in the temperature cycle performance of materials. The results in Table 10 above were expressed as a Weibull distribution (FIG. 23) and survival probability (FIG. 24).

Although the preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A lead-free solder alloy which is used in printed circuit boards which have been treated with nickel (Ni)/gold (Au), the alloy comprising:

0.8-1.2 wt % silver (Ag), 0.8-1.2 wt % copper (Cu), 0.01-1.0 wt % palladium (Pd), 0.001-0.1 wt % tellurium (Te), and a balance of tin (Sn), and at least one element selected from the group consisting of cobalt (Co), ruthenium (Ru), rhodium (Rh), lanthanum (La), cerium (Ce) and germanium (Ge), wherein cobalt (Co), ruthenium (Ru) and rhodium (Rh) form $CoSn_2$, $Ru_3Sn_7$ and $RhSn_2$ compounds, respectively, which reduce interfacial energy in the solder alloy, thus refining grain boundaries.

2. The lead-free solder alloy of claim 1, wherein lanthanum (La), cerium (Ce) and germanium (Ge) form $LaSn_3$, $CeSn_3$ and $Ge_ySn_{1-y}$ amorphous compounds (y is any real number), respectively.

3. The lead-free solder alloy of claim 1, wherein the content of each of said additional elements is 0.001-0.1 wt %.

4. The lead-free solder alloy of claim 1, wherein the sum of the contents of two or more elements selected from said group is 0.001-0.2 wt %.

5. The lead-free solder alloy of claim 1, wherein intermetallic compounds of $(Cu, Ni)_6Sn_5$ and $Cu_6Sn_5$ are formed by Cu and Sn of the solder alloy and Ni of the printed circuit board, and palladium (Pd) and copper (Cu) bind to each other at the interface of the intermetallic compounds to form a $Cu_3Pd$ compound and a $PdSn_4$ compound, such that needle structures of the intermetallic compounds become denser and have a chain structure.

6. The lead-free solder alloy of claim 1, wherein intermetallic compounds of $(Cu, Ni)_6Sn_5$ and $Cu_6Sn_5$ are formed by Cu and Sn of the solder alloy and Ni of the printed circuit board, and tellurium (Te) and copper (Cu) bind to each other at the interface of the intermetallic compounds to form a $Cu_2Te$ compound, such that needle structures of the intermetallic compounds become denser and have a chain structure.

* * * * *